US012770678B2

(12) United States Patent
Liaw

(10) Patent No.: US 12,770,678 B2
(45) Date of Patent: Oct. 20, 2026

(54) DUAL-PORT MEMORY STRUCTURE WITH BIT-LINE PAIRS LOCATED ON DIFFERENT TWO LEVEL METAL LAYERS RESPECTIVELY

(71) Applicant: Taiwan Semiconductor Manufacturing Company, Ltd., Hsinchu (TW)

(72) Inventor: Jhon-Jhy Liaw, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 85 days.

(21) Appl. No.: 18/745,198

(22) Filed: Jun. 17, 2024

(65) Prior Publication Data

US 2025/0384920 A1 Dec. 18, 2025

(51) Int. Cl.
*G11C 11/412* (2006.01)
*G11C 11/417* (2006.01)
*H10B 10/00* (2023.01)

(52) U.S. Cl.
CPC .......... *G11C 11/412* (2013.01); *G11C 11/417* (2013.01); *H10B 10/12* (2023.02)

(58) Field of Classification Search
CPC ...... G11C 11/412; G11C 11/417; H10B 10/12
See application file for complete search history.

(56) References Cited

U.S. PATENT DOCUMENTS 6,084,820 A * 7/2000 Raszka .................... G11C 8/16 365/230.05
8,009,463 B2 8/2011 Liaw
8,189,368 B2 5/2012 Liaw
8,315,084 B2 11/2012 Liaw et al.
8,675,397 B2 3/2014 Liaw
8,929,153 B1 * 1/2015 Gulati .................. G11C 11/412 365/189.02
8,995,176 B2 3/2015 Liaw
9,099,172 B2 8/2015 Liaw
9,373,386 B2 6/2016 Liaw
9,418,728 B2 8/2016 Liaw
9,613,953 B2 4/2017 Liaw
9,646,974 B1 5/2017 Liaw
9,773,545 B2 9/2017 Liaw
9,793,273 B2 10/2017 Liaw
9,805,985 B2 10/2017 Liaw
9,824,747 B2 11/2017 Liaw
9,858,985 B2 1/2018 Liaw
9,916,893 B2 3/2018 Liaw
10,170,480 B2 1/2019 Liaw
2023/0013845 A1 1/2023 Liaw
2024/0332408 A1 * 10/2024 Chang ................ H10D 84/0188

* cited by examiner

*Primary Examiner* — Alexander Sofocleous
*Assistant Examiner* — Joseph Fidelis Stormes
(74) *Attorney, Agent, or Firm* — Birch, Stewart, Kolasch & Birch, LLP

(57) ABSTRACT

A dual-port memory structure includes a plurality of grouped-cells, a first bit-line pair and a second bit-line pair. The grouped-cells are in a word-line routing direction, wherein each grouped-cell comprises a plurality of dual-port memory cells adjacently disposed and is placed in the word-line routing direction. The dual-port memory cells of each grouped-cell share the first bit-line pair and the second bit-line pair, and the first bit-line pair and the second bit-line pair are located on different two of a plurality of level metal layers.

20 Claims, 26 Drawing Sheets

DUAL-PORT MEMORY STRUCTURE WITH BIT-LINE PAIRS LOCATED ON DIFFERENT TWO LEVEL METAL LAYERS RESPECTIVELY

BACKGROUND

In deep sub-micron technology, the embedded SRAM (particularly on 8T SRAM) has become a very popular storage unit of high-speed communication, image processing and SoC (System on Chip) products. Specially, the Dual port SRAM (DP SRAM) is allowed parallel operation (1cycle comprises 1R (read) 1W (write), 2R (read)) or 2W (write)) and therefore have higher bandwidth than signal port SRAM. To meet continuous scaling requirements, the lower loading and highly process margin cell structure become very important factors in embedded memory and SoC products.

SRAM Bit-lines prefer to put in lowest level metallization layer (M1: lowest metal layer) for bit-line capacitance reduction, but the lowest level metal usually pushes the metal pitch to limitation for Logic circuit routing density improvement. When metal thickness and line width are continuous shrunk, this induces high resistance issue in SRAM bit-line and $V_{SS}$ conductors (IR drop concern) and therefore impact the cell speed and V_min performance. To have lower metal resistance for bit-line and $V_{SS}$ conductors, the metal width should be designed as wider as possible. But DP-cell also required more complex BEOL (Back-end-of-line) metal routing due to multiple word-lines routing requirement.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
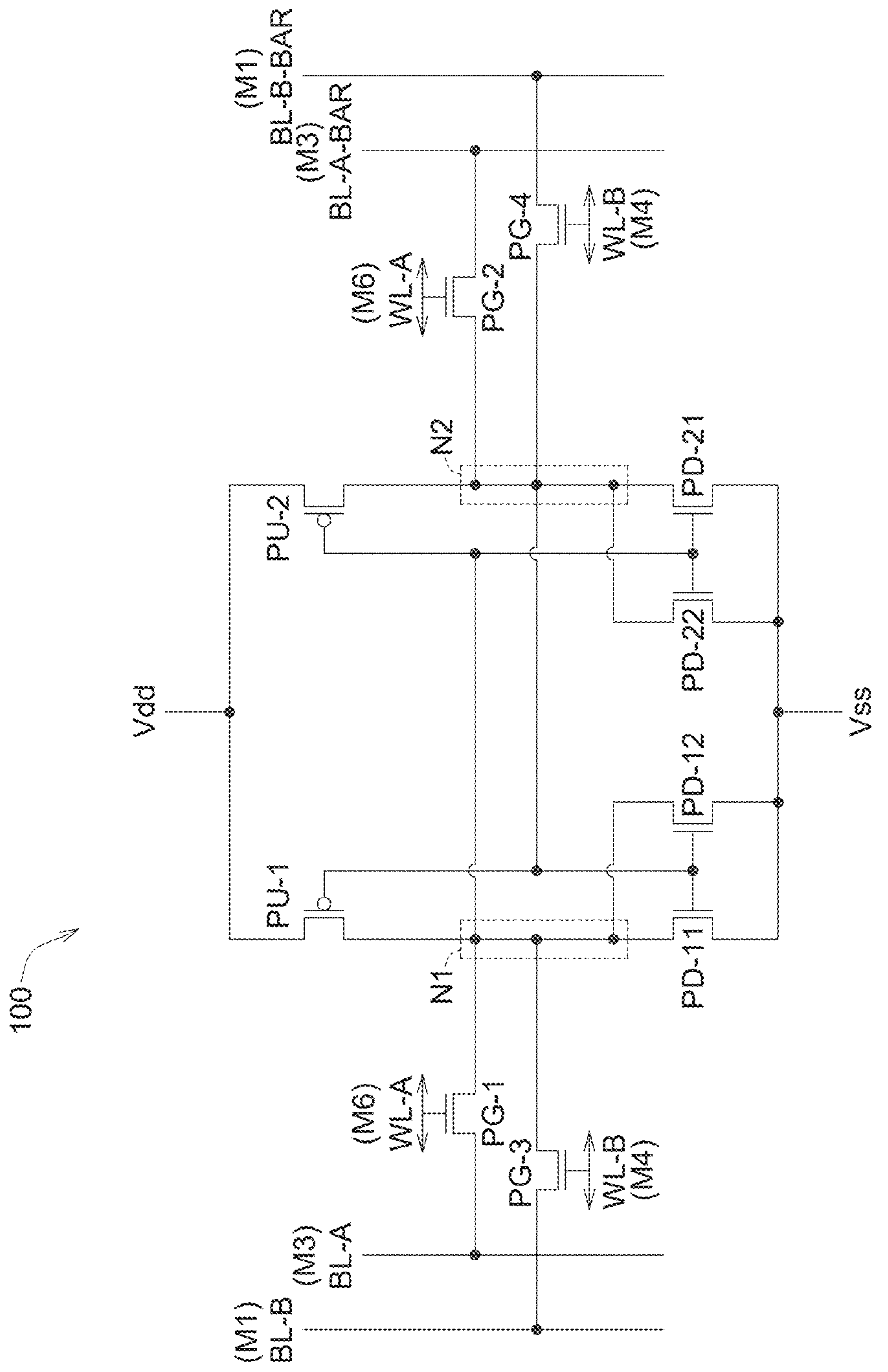
FIG. 1 illustrates a schematic diagram of a circuit of a dual-port memory structure 100 according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
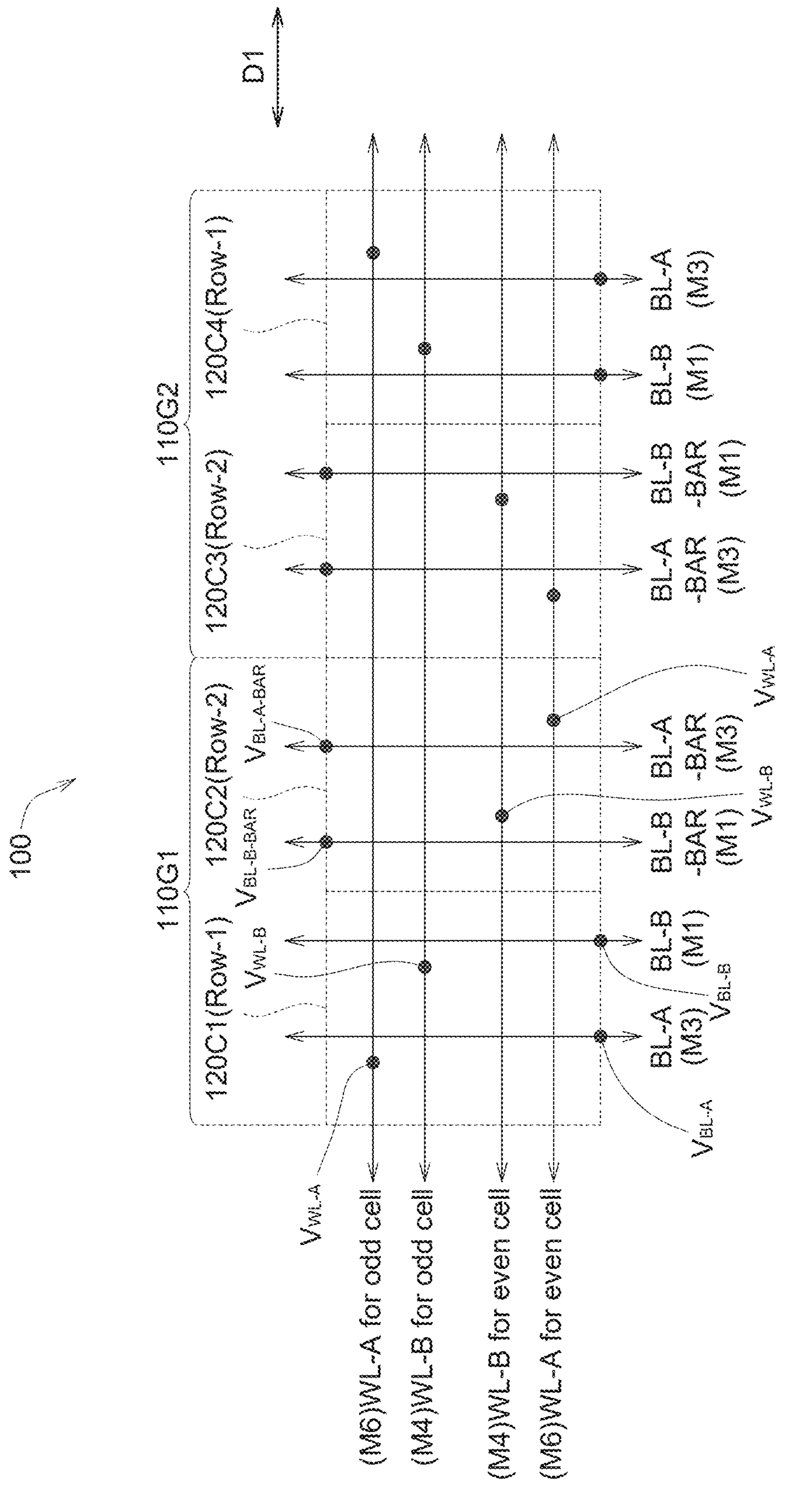
FIG. 2 illustrates a schematic diagram of a plurality of grouped-cells of the dual-port memory structure 100 in FIG. 1.

Referring to FIGS. 1 and 2, FIG. 1 illustrates a schematic diagram of a circuit of a dual-port memory structure 100 according to an embodiment of the present disclosure, and FIG. 2 illustrates a schematic diagram of a plurality of grouped-cells of the dual-port memory structure 100 in FIG. 1. In an embodiment, the dual-port memory structure 100 includes a dual-port (DP) Static random-access memory (SRAM) cell array, for example.

As illustrated in FIGS. 1 and 2, the dual-port memory structure 100 includes a plurality of grouped-cells (for example, a first grouped-cell 110G1 and a second grouped-cell 110G2), a first bit-line (BL) pair (including, for example, a first bit-line BL-A and a first bit-line-bar BL-A-BAR) and a second bit-line pair (including, for example, a second bit-line BL-B and a second bit-line-bar BL-B-BAR). The grouped-cells are in a word-line (WL) routing direction D1, wherein each grouped-cell includes a plurality of dual-port memory cells (for example, the first grouped-cell 110G1 includes a first dual-port memory cell 120C1 and a second dual-port memory cell 120C2, and the second grouped-cell 110G2 includes a third dual-port memory cell 120C3 and a fourth dual-port memory cell 120C4) adjacently disposed and placed in the word-line routing direction D1. In another embodiment, the number of the grouped-cells may be more than two, and accordingly the number of the dual-port memory cells may be more than four.

In an embodiment, each dual-port memory cell is a rectangular shape and has a first pitch (for example, in X-axis, the word-line direction) and a second pitch (for example, in Y-pitch, the bit-line direction). The second pitch may be same as 4 times of gate pitch (CPP) and a pitch ratio of the first pitch to the second pitch is within a range of 0.7 and 1.4.

As illustrated in FIG. 2, the first grouped-cell 110G1 may be defined as column-1, and the second grouped-cell 110G2 may be defined as column-2. In the first grouped-cell 110G1, the first dual-port memory cell 120C1 may be defined as row-1, and the second dual-port memory cell 120C2 may be defined as row-2. In the second grouped-cell 110G2, the third dual-port memory cell 120C3 may be defined as row-2, and the fourth dual-port memory cell 120C4 may be defined as row-1.

As illustrated in FIG. 1, the dual-port memory structure 100 includes a first inverter and a second inverter that are cross-coupled. In the present embodiment, one dual-port memory cell may include ten devices, wherein the device is, for example, a transistor. Furthermore, the first inverter includes a first pull-up device PU-1 formed by a p-type metal-oxide-semiconductor field-effect transistor (PMOSFET), a first pull-down device PD-11 formed by an n-type MOSFET (NMOSFET), and a second pull-down device PD-12 formed by a NMOSFET. The second inverter includes a second pull-up device PU-2 formed by a PMOSFET, a third pull-down device PD-21 formed by an NMOSFET, and a fourth pull-down device PD-22 formed by an NMOSFET. The drain nodes (or drains) of the first pull-up device PU-1, the first pull-down device PD-11 and the second pull-down device PD-12 are electrically connected together, defining a first data node (or a first node N1). The drain nodes (or drains) of the second pull-up device PU-2, the third pull-down device PD-21 and the fourth pull-down device PD-22 are electrically connected together, defining a second data node (or a second node N2 or data node bar). The gate nodes (or gates) of the first pull-up device PU-1, the first pull-down device PD-11 and the second pull-down device PD-12 are electrically connected and coupled to the second node N2. The gate nodes (or gates) of the second pull-up device PU-2, the third pull-down device PD-21 and the fourth pull-down device PD-22 are electrically connected and coupled to the first node N1. The source nodes (or sources) of the first pull-up device PU-1 and the second pull-up device PU-2 are electrically connected to a power line $V_{dd}$. The source nodes (or sources) of the first pull-down device PD-11, the second pull-down device PD-12, the third pull-down device PD-21 and the fourth pull-down device PD-22 are electrically connected to a complementary power line $V_{SS}$. In an embodiment of the DP SRAM cell layout, the sources of the first pull-down device PD-11 and the second pull-down device PD-12 are electrically connected to a first $V_{SS}$ line while the third pull-down device PD-21 and the fourth pull-down device PD-22 are electrically connected to a second $V_{SS}$ line.

As illustrated in FIG. 1, the dual-port memory structure 100 further includes a first port (for example, port-A) and a second port (for example, port-B). In an embodiment, the port-A and port-B at least include pass-gate devices, for example, a first pass-gate device PG-1, a second pass-gate device PG-2, a third pass-gate device PG-3 and a fourth pass-gate device PG-4. Each of the pass-gate devices may include a NMOSFET. In an embodiment, the port-A includes the first pass-gate device PG-1 and the second pass-gate device PG-2, and the port-B includes the third pass-gate device PG-3 and the fourth pass-gate device PG-4.

As illustrated in FIG. 1, the first pass-gate device PG-1 includes a drain node (or drain), a source node (or source) and a gate node (or gate), wherein the drain of the first pass-gate device PG-1 is electrically connected to the first bit-line BL-A, the source of the first pass-gate device PG-1 is electrically connected to the first node N1, and the gate of the first pass-gate device PG-1 is electrically connected to a first word-line (referred to as port-A WL) WL-A. The second pass-gate device PG-2 includes a drain node (or drain), a source node (or source) and a gate node (or gate), wherein the drain of the second pass-gate device PG-2 is electrically connected to a first bit-line-bar BL-A-BAR, the source of the second pass-gate device PG-2 is electrically connected to the second node N2, and the gate of the second pass-gate device PG-2 is electrically connected to the first word-line WL-A. The third pass-gate device PG-3 includes a drain node (or drain), a source node (or source) and a gate node (or gate), wherein the drain the third pass-gate device PG-3 is electrically connected to the second bit-line BL-B, the source of the third pass-gate device PG-3 is electrically connected to the first node N1, and the gate of the third pass-gate device PG-3 is electrically connected to a second word-line (referred to as port-B WL) WL-B. The fourth pass-gate device PG-4 includes a drain node (or drain), a source node (or source) and a gate node (or gate), wherein the drain of the fourth pass-gate device PG-4 is electrically connected to a second bit-line-bar BL-B-BAR, the source of the fourth pass-gate device PG-4 is electrically connected to the second node N2, and the gate node of the fourth pass-gate device PG-4 is electrically connected to the second word-line WL-B.

Various NMOSFETs and PMOSFETs may be formed by any proper technology. In one embodiment, the various NMOSFETs and PMOSFETs are formed by conventional MOSFETs. In another embodiment, the various NMOSFETs and PMOSFETs are formed by Fin-like field effect transistors (FinFETs). In another embodiment, the various NMOSFETs and PMOSFETs are formed using high k/metal gate technology. The dual-port memory structure 100 may include additional devices such as additional pull-down devices and pass-gate devices. In an embodiment, the dual-port memory structure 100 includes more pull-down devices than pass-gate devices.

In the present embodiment, the dual-port memory cells of each grouped-cell share the first bit-line pair and the second bit-line pair, and the first bit-line pair and the second bit-line pair are located on different two of a plurality of level metal layers. As a result, it may simplify circuit design of the level metal layers.

In an embodiment, in the first grouped-cell 110G1, the first dual-port memory cell 120C1 and the second dual-port memory cell 120C2 share the first bit-line pair including the first bit-line BL-A and the first bit-line-bar BL-A-BAR and share the second bit-line pair including the second bit-line BL-B and the second bit-line-bar BL-B-BAR. Similarly, in the second grouped-cell 110G2, the third dual-port memory cell 120C3 and the fourth dual-port memory cell 120C4 share the first bit-line pair including the first bit-line BL-A and the first bit-line-bar BL-A-BAR and share the second bit-line pair including the second bit-line BL-B and the second bit-line-bar BL-B-BAR. In addition, in the first bit-line pair, the first bit-line BL-A is located on a third level metal layer M3, and the first bit-line-bar BL-A-BAR is located on a first level metal layer M1. Similarly, in the second bit-line pair, the second bit-line BL-B is located on the first level metal layer M1, and the second bit-line-bar BL-B-BAR is located on the third level metal layer M3.

As illustrated in FIG. 2, the dual-port memory structure 100 further includes at least one via $V_{BL-A}$, at least one via $V_{BL-A-BAR}$, at least one via $V_{BL-B}$ and at least one via $V_{BL-B-BAR}$. A plurality of the dual-port memory cells of each grouped-cell may share the first bit-line BL-A through the same via. For example, in the first grouped-cell 110G1, the first dual-port memory cell 120C1 and the second dual-port memory cell 120C2 may share the first bit-line BL-A through the via $V_{BL-A}$. In addition, a plurality of the dual-port memory cells of each grouped-cell may share the first bit-line-bar BL-A-BAR through the same via. For example, in the first grouped-cell 110G1, the first dual-port memory cell 120C1 and the second dual-port memory cell 120C2 may share the first bit-line-bar BL-A-BAR through the via $V_{BL-A-BLA}$. In addition, a plurality of the dual-port memory cells of each grouped-cell may share the second bit-line BL-B through the same via. For example, in the first grouped-cell 110G1, the first dual-port memory cell 120C1 and the second dual-port memory cell 120C2 may share the second bit-line BL-B through the via $V_{BL-B}$. In addition, a plurality of the dual-port memory cells of each grouped-cell may share the second bit-line-bar BL-B-BAR through the same via. For example, in the first grouped-cell 110G1, the first dual-port memory cell 120C1 and the second dual-port memory cell 120C2 may share the second bit-line-bar BL-B-BAR through the via $V_{BL-B-BAR}$.

As illustrated in FIG. 2, the dual-port memory structure 100 further includes a plurality of first word-lines WL-A and a plurality of second word-lines WL-B. The first word-lines WL-A and the second word-lines WL-B are located on different two of the level metal layers. As a result, it may simplify circuit design of the level metal layers.

In an embodiment, the first word-lines WL-A are located on a sixth level metal layers M6, and the second word-lines WL-B are located on a fourth level metal layers M4. In addition, one of the first word-lines WL-A may be connected with the cell in odd row (for example, Row-1), for example, the first dual-port memory cell 120C1 and the fourth dual-port memory cell 120C4, while another of the first word-lines WL-A may be connected with the cell in even row (for example, Row-2), for example, the second dual-port memory cell 120C2 and the third dual-port memory cell 120C3. In addition, one of the second word-lines WL-B may be connected with the cell in odd row (for example, Row-1), for example, the first dual-port memory cell 120C1 and the fourth dual-port memory cell 120C4, while another of the second word-lines WL-B may be connected with the cell in even row (for example, Row-2), for example, the second dual-port memory cell 120C2 and the third dual-port memory cell 120C3.

Figure 3:
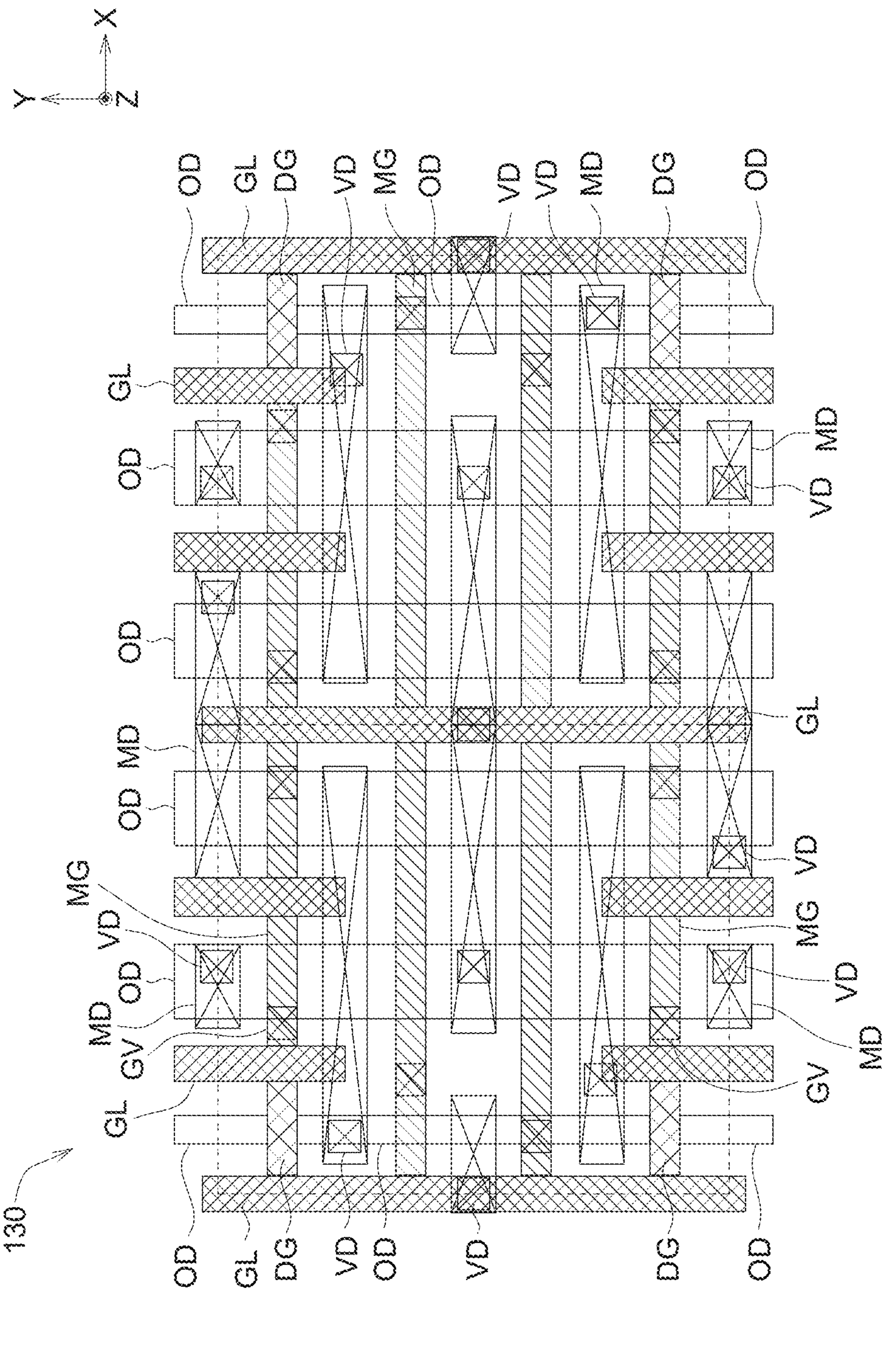
FIG. 3 illustrates a schematic diagram of a structure 130 of each dual-port memory cell in FIG. 2.
Figure 4:
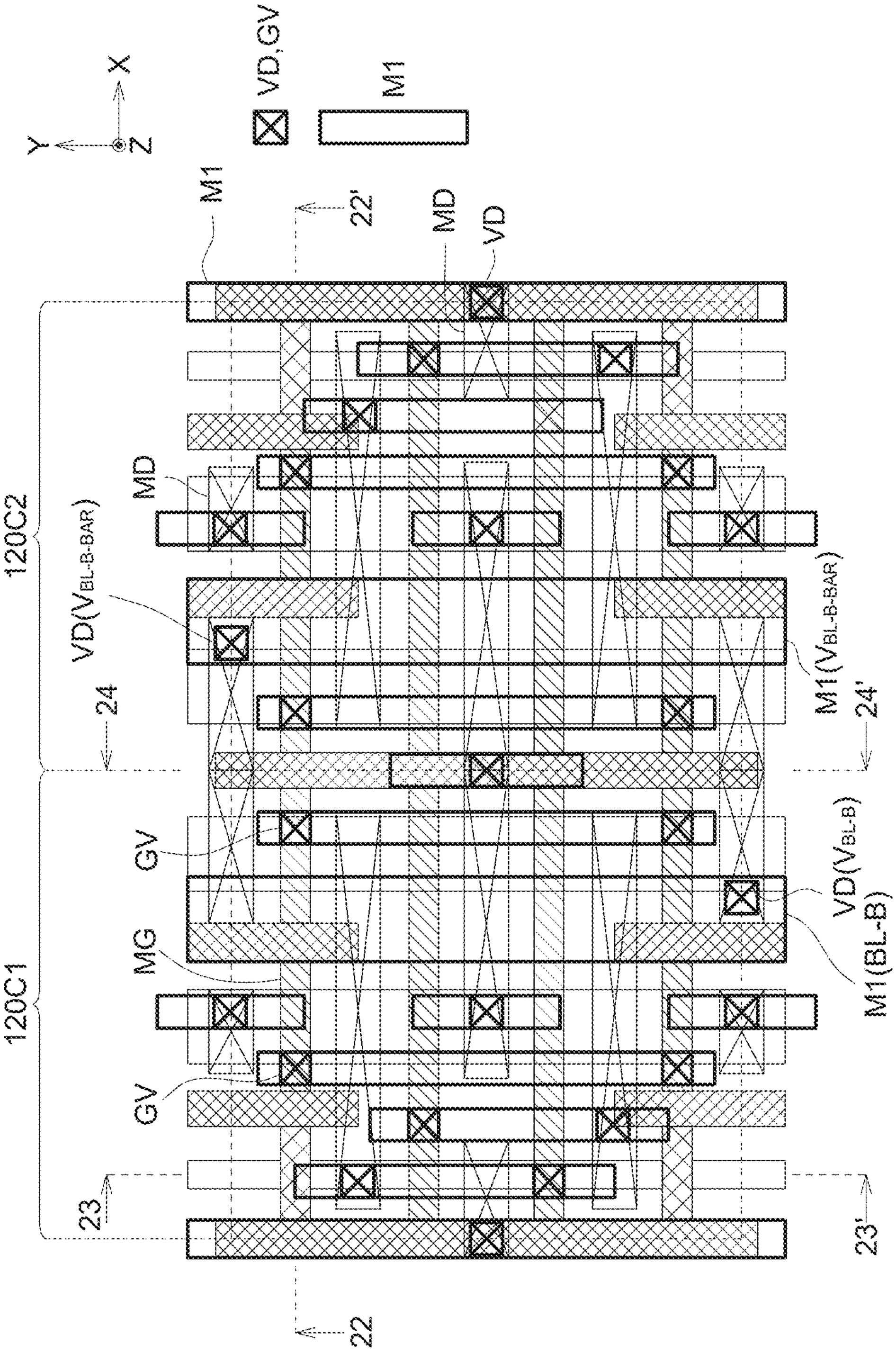
FIG. 4 illustrates a schematic diagram of the first level metal layer M1 formed over the structure 130 in FIG. 3.
Figure 5:
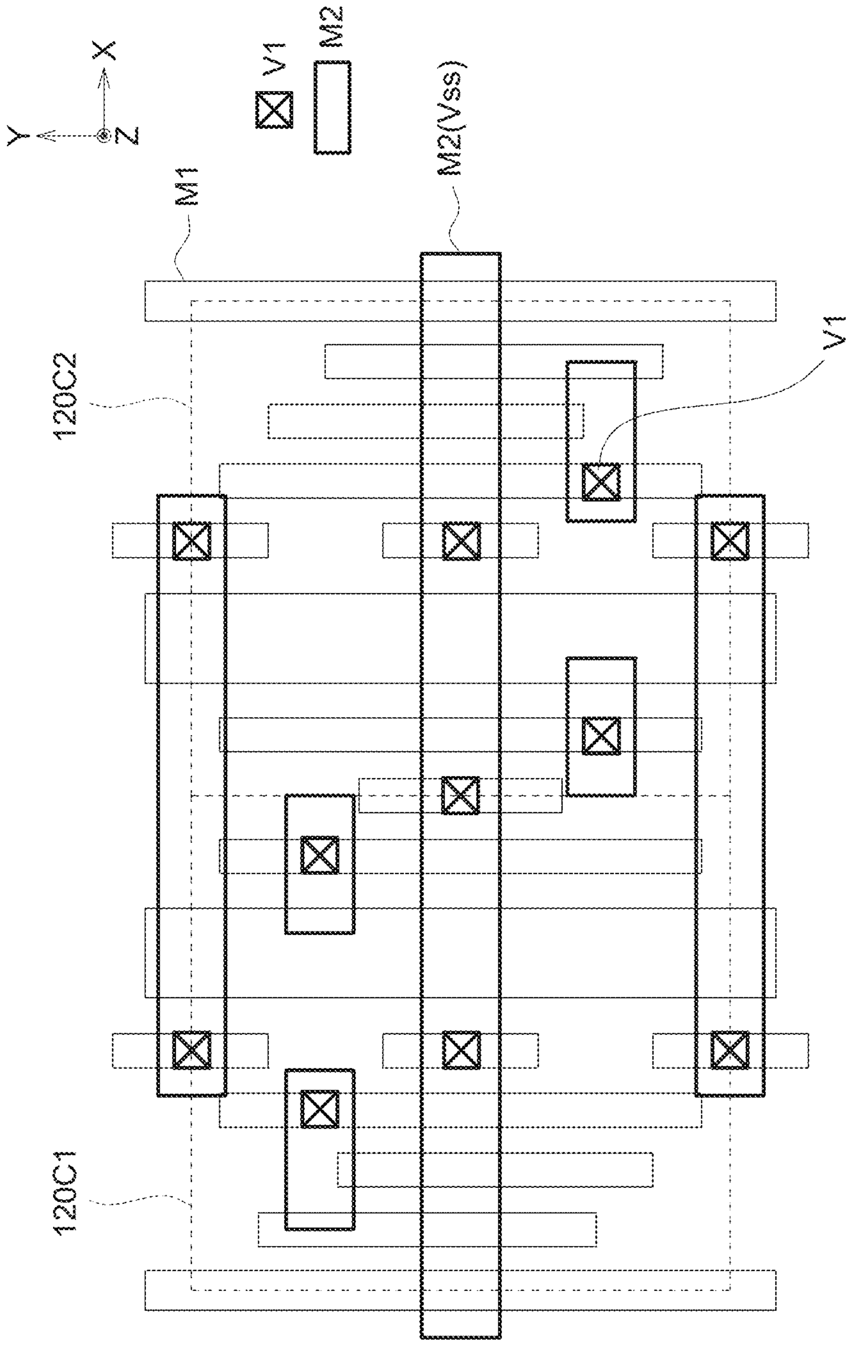
FIG. 5 illustrates a schematic diagram of a second level metal layer M2 formed over the first level metal layer M1 in FIG. 4.
Figure 6:
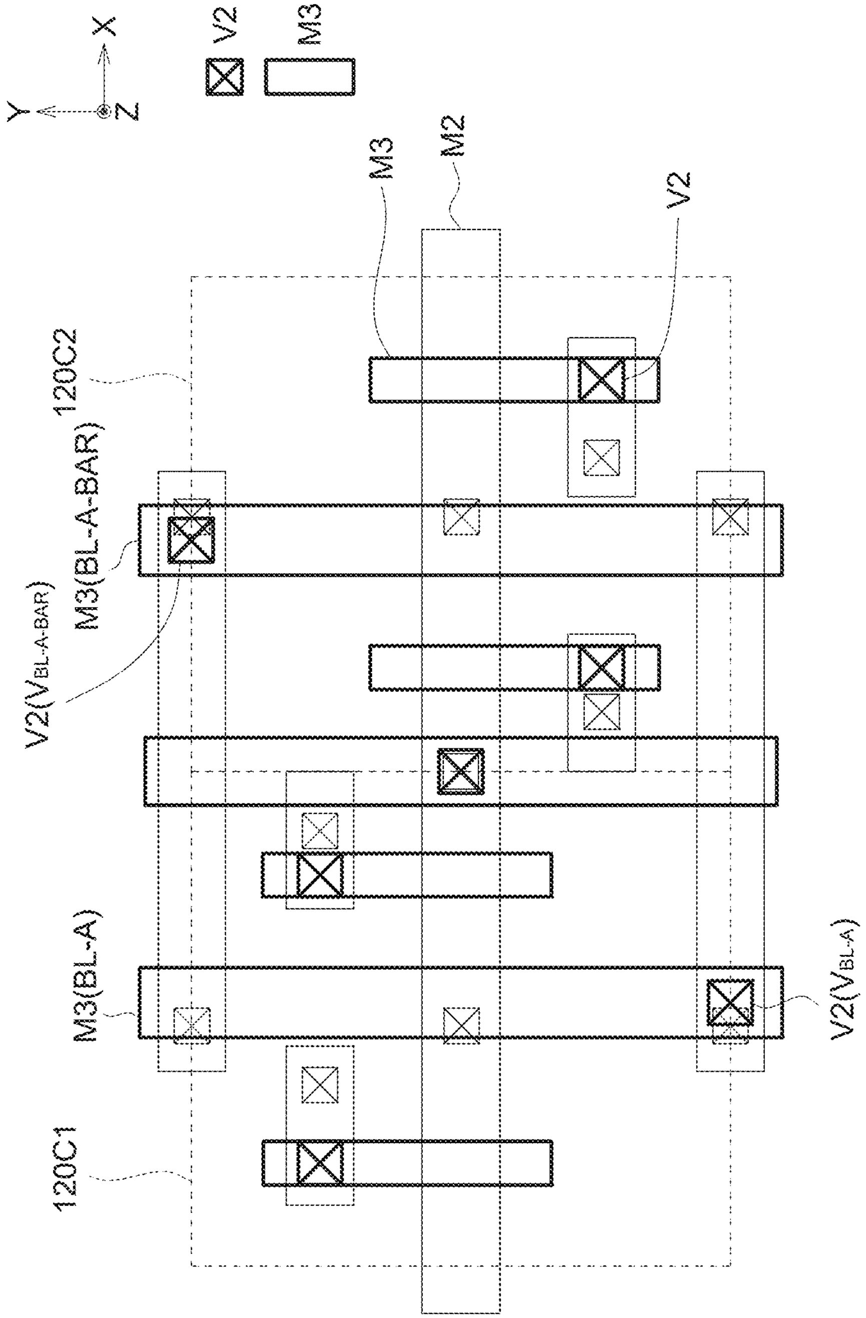
FIG. 6 illustrates a schematic diagram of the third level metal layer M3 formed over the second level metal layer M2 in FIG. 5.
Figure 7:
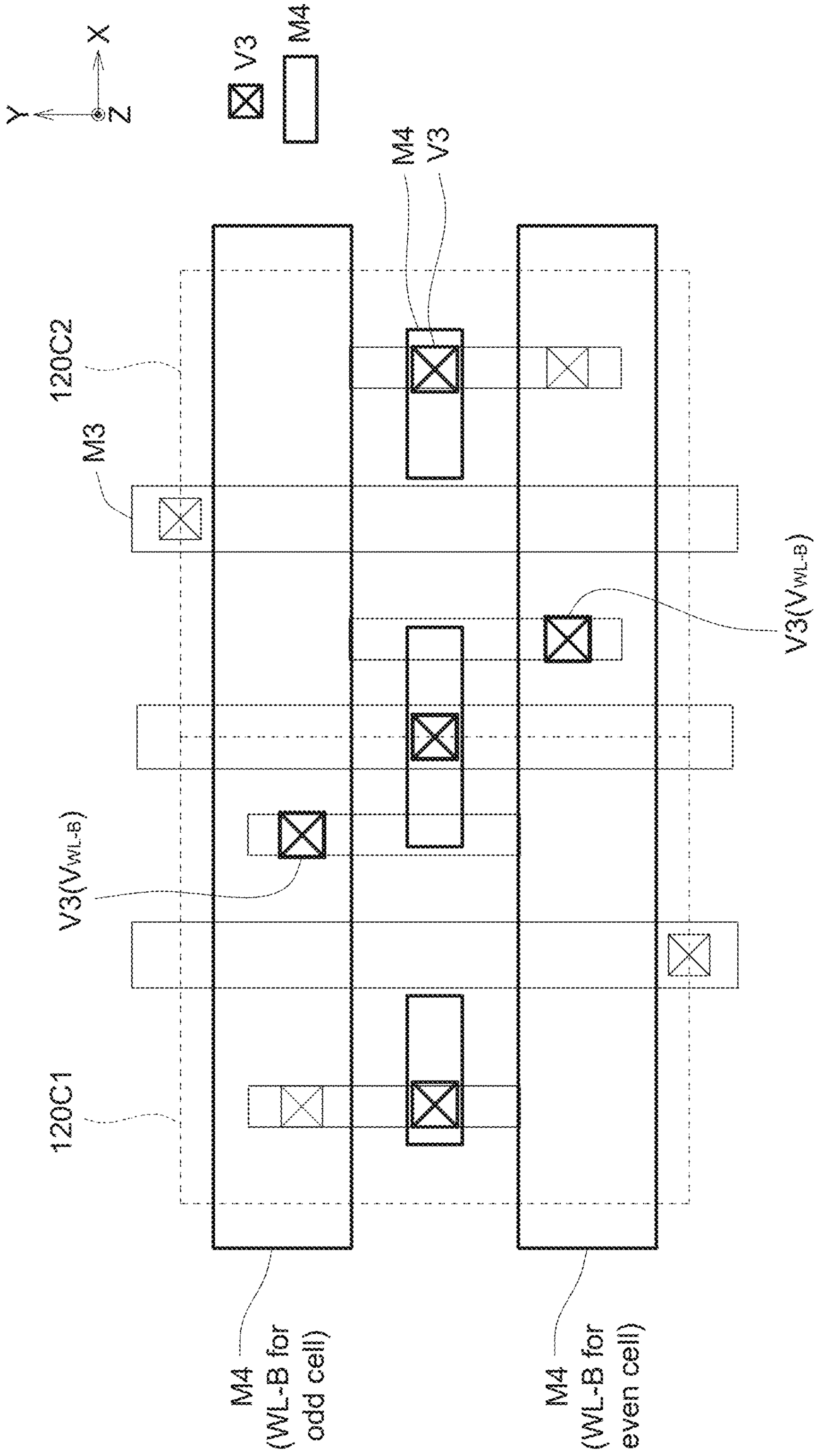
FIG. 7 illustrates a schematic diagram of a fourth level metal layer M4 formed over the third level metal layer M3 in FIG. 6.
Figure 8:
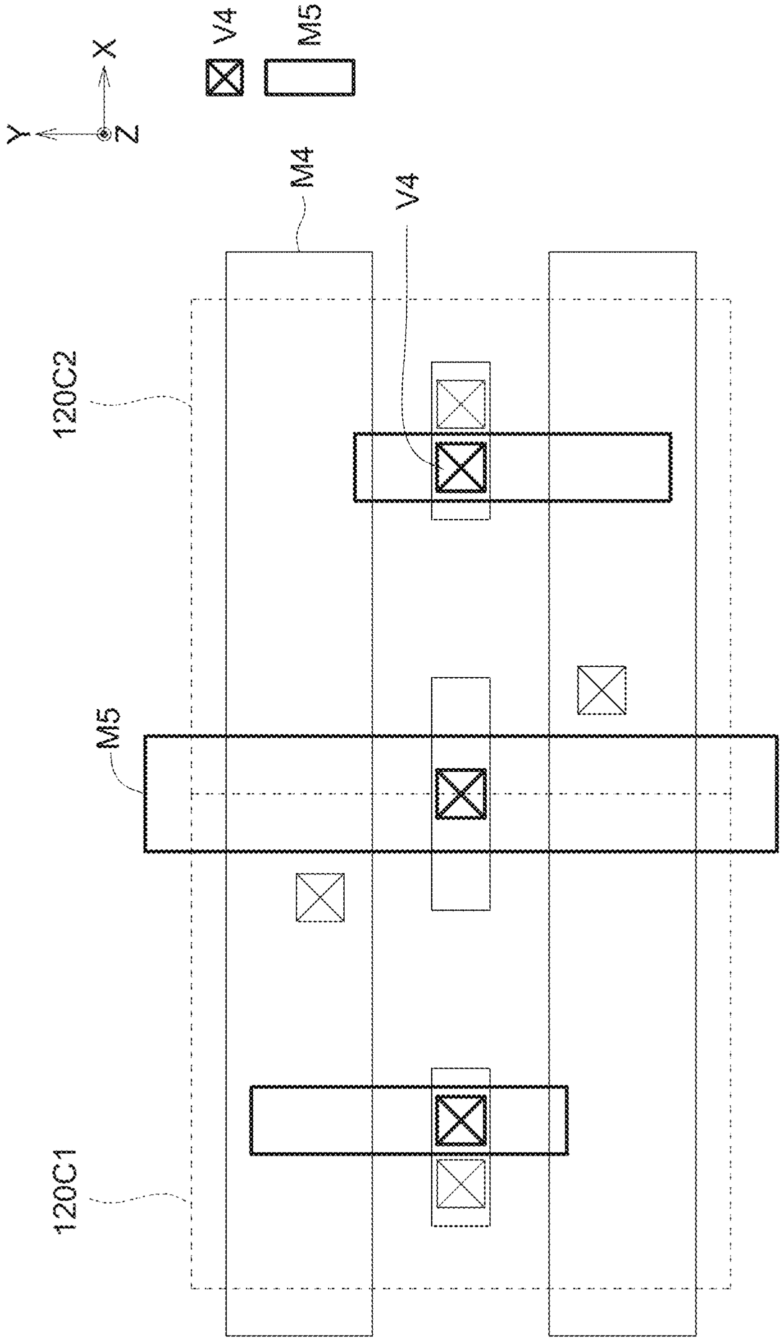
FIG. 8 illustrates a schematic diagram of a fifth level metal layer M5 formed over the fourth level metal layer M4 in FIG. 7.
Figure 9:
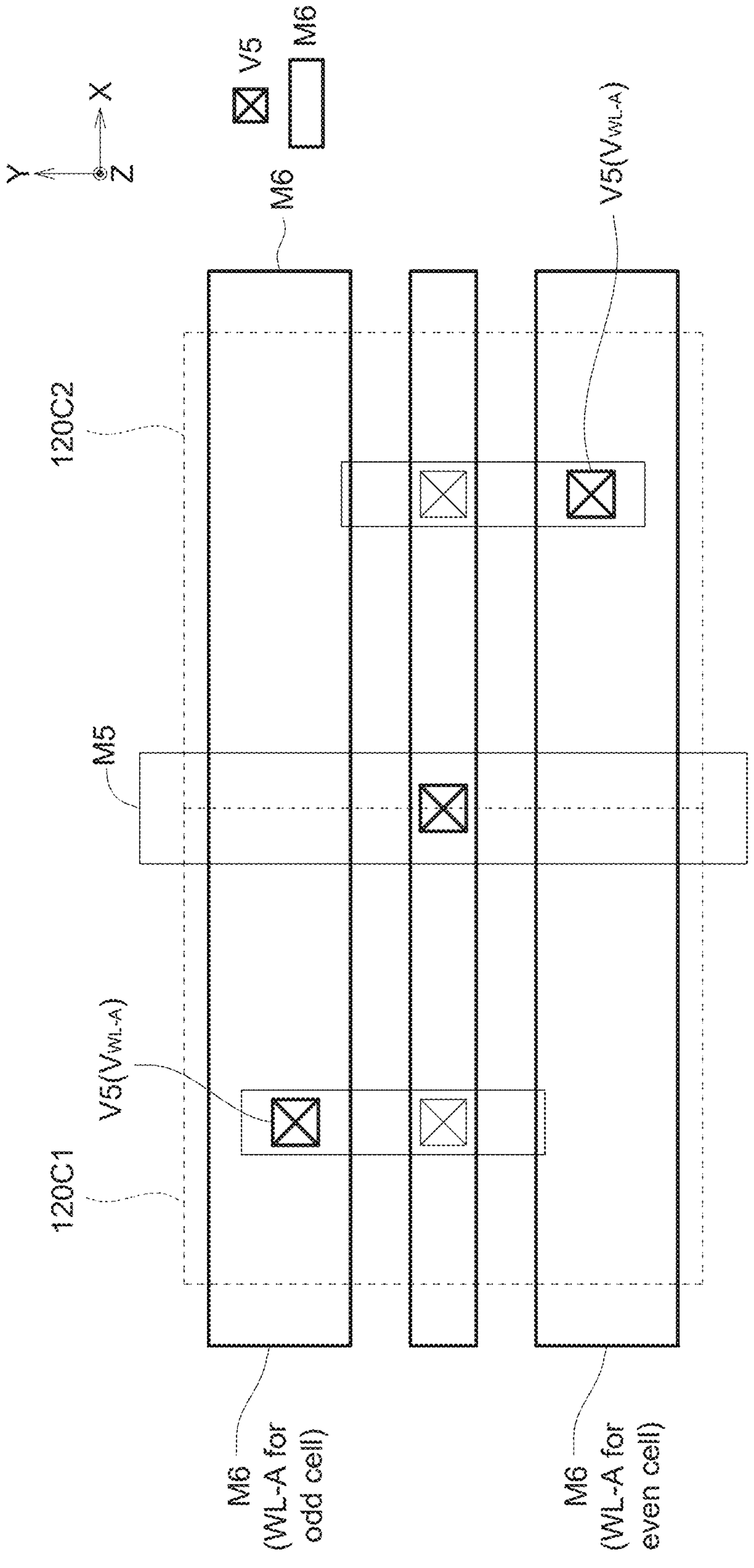
FIG. 9 illustrates a schematic diagram of the sixth level metal layer M6 formed over the fifth level metal layer M5 in FIG. 8.

Referring to FIGS. 3 to 9, FIG. 3 illustrates a schematic diagram of a structure 130 of each dual-port memory cell in FIG. 2, FIG. 4 illustrates a schematic diagram of the first level metal layer M1 formed over the structure 130 in FIG. 3, FIG. 5 illustrates a schematic diagram of a second level metal layer M2 formed over the first level metal layer M1 in FIG. 4, FIG. 6 illustrates a schematic diagram of the third level metal layer M3 formed over the second level metal layer M2 in FIG. 5, FIG. 7 illustrates a schematic diagram of a fourth level metal layer M4 formed over the third level metal layer M3 in FIG. 6, FIG. 8 illustrates a schematic diagram of a fifth level metal layer M5 formed over the fourth level metal layer M4 in FIG. 7, and FIG. 9 illustrates a schematic diagram of the sixth level metal layer M6 formed over the fifth level metal layer M5 in FIG. 8.

The level metal layers M1 to M6 in FIGS. 4 to 9 are formed over the structure 130 in FIG. 3 in sequence. Furthermore, the metal layers from the lowest level (close to the gate) to the higher level are following a sequence of M1, M2, M3, M4, M5, M6. These level metal layers make the dual-port memory structure 100 be a tall-type DP SRAM. In addition, the level metal layer may be formed of a material including, for example, Ta, TaN, TiN, Cu, Co, W, Ru, Al, Mo, Ir or a combination thereof.

As illustrated in FIG. 3, the structure 130 may include a front-end-of-line (FEOL) structure, or include the FEOL structure and a middle-of-line (MOL) structure. The structure 130 at least includes a plurality of oxide diffusions (or oxide diffusion lines) OD, a plurality of metal gates MG, a plurality of gate vias GV, a plurality of epitaxy vias VD, a plurality of diffusion metals MD, a plurality of gate end dielectric layer lines (or "cut metal gate (CMG)") GL and a plurality of dielectric gates DG. The oxide diffusions OD may extend in Y-axis. Each dual-port memory cell includes ten devices (the pull-down devices PU, the pass-gate devices PG and the pull-down devices PD as illustrated in FIG. 1) forming upon three continuous oxide diffusion lines (designated as "OD").

As illustrated in FIG. 3, the metal gates MG may extend in X-axis. Each gate via GV may extend in Z-axis to connect the corresponding metal gate MG. Although not illustrated, the structure 130 further includes a plurality of epitaxies which formed two sides of each metal gate MG. The epitaxies and the metal gates MG may form at least one transistor, wherein one of the epitaxies is, a source of the transistor, and another of the epitaxies is, a drain of the transistor. Each diffusion metal MD may extend in Z-axis to connect the corresponding epitaxy, and each epitaxy via VD may extend in Z-axis to connect the corresponding diffusion metal MD. In an embodiment, the diffusion metal MD is disposed between the corresponding epitaxy and epitaxy via VD.

As illustrated in FIG. 3, one of the continuous oxide diffusions OD may be broken by one of the dielectric gates DG. The dielectric gate DG may divide one oxide diffusion layer into a plurality of the oxide diffusions OD. At least one dielectric gate DG separate two adjacent oxide diffusions OD.

As illustrated in FIG. 3, in the present embodiment, the dual-port memory cells of each grouped-cell share the first bit-line pair and the second bit-line pair, and the first bit-line pair and the second bit-line pair are located on different two of a plurality of level metal layers. As a result, it may simplify circuit design of the level metal layers. For example, in one grouped-cell, the metal gates MG in one dual-port memory cell form a regular structure, and the patterns of the metal gates MG in two dual-port memory cells 120C1 and 120C2 are substantially symmetrical relative to the gate end dielectric layer lines GL at a connection (or boundary) of two cells. Similarly, in one grouped-cell, the oxide diffusions OD in one dual-port memory cell form a regular structure, and the patterns of the oxide diffusions OD in two dual-port memory cells 120C1 and 120C2 are substantially symmetrical relative to the gate end dielectric layer lines GL at the connection (or boundary) of two cells. Similarly, in one grouped-cell, the diffusion metals MD in one dual-port memory cell form a regular structure, and the patterns of the diffusion metals MD in two dual-port memory cells 120C1 and 120C2 are substantially symmetrical relative to the gate end dielectric layer lines GL at the connection (or boundary) of two cells. Similarly, in one grouped-cell, the dielectric gates DG in one dual-port memory cell form a regular structure, and the patterns of the dielectric gates DG in adjacent two dual-port memory cells (the dual-port memory cells 120C1 and 120C2) are substantially symmetrical relative to the gate end dielectric layer lines GL at the connection (or boundary) of adjacent two dual-port memory cells.

As illustrated in FIG. 3, the gate end dielectric layer lines GL may divide a continuous metal gate layer into the metal gates MG. One of the gate end dielectric layer lines GL is located at a first cell boundary of two adjacent dual-port memory cells to separate the gate ends of the pull-down devices (PD) and the pass-gate devices (PG) of two adjacent cells, and another of the gate end dielectric layer lines GL is located at a second cell boundary of two adjacent dual-port memory cells to separate the gate ends of the pull-up devices (PU) of two adjacent cells. In a boundary between two cells (for example, the first dual-port memory cell 120C1 and the second dual-port memory cell 120C2), the continuous gate end dielectric layer line GL crosses the whole cell in Y-axis to separate the gate layers of the two cells and following the bit-line routing direction. In addition, the gate end dielectric layer line GL may be single dielectric layer or multiple layers, and formed of a material selected from a group consisting of $Si_3N_4$, nitride based dielectric layer, $SiO_2$, SiOC, SiON, SiOCN, carbon content oxide, nitrogen content oxide, carbon and nitrogen content oxide, metal oxide dielectric, Hf oxide ($HfO_2$), Ta oxide ($Ta_2O_5$), Ti oxide ($TiO_2$), Zr oxide ($ZrO_2$), Al oxide ($Al_2O_3$), Y oxide ($Y_2O_3$), multiple metal content oxide or combination thereof.

As illustrated in FIG. 4, each grouped-cell further includes the first level metal layer M1, wherein the first level metal layer M1 is formed over the structure 130 in FIG. 3. The first level metal layer M1 is electrically connected with the metal gates MG through the gate vias GV, and is electrically connected with the diffusion metals MD through the epitaxy through the diffusion metal MD and the epitaxy via VD. In addition, the first level metal layer M1 includes the second bit-line BL-B and the second bit-line-bar BL-B-BAR, and the epitaxies via VD include the via $V_{BL-B}$ (also illustrated in FIG. 2) and the via $V_{BL-B-BAR}$ (also illustrated in FIG. 2), wherein the via $V_{BL-B}$ is connected with the second bit-line BL-B, and the via $V_{BL-B-BAR}$ is connected with the second bit-line-bar BL-B-BAR.

As illustrated in FIG. 5, each grouped-cell further includes the second level metal layer M2 and a plurality of first vias V1, wherein the first vias V1 may extend in Z-axis to connect the first level metal layer M1 with the second level metal layer M2. The second level metal layer M2 is formed over the first level metal layer M1, and is electrically connected with the first level metal layer M1 through the first vias V1. In addition, the second level metal layer M2 further includes the aforementioned power line $V_{SS}$.

As illustrated in FIG. 6, each grouped-cell further includes the third level metal layer M3 and a plurality of second vias V2, wherein the second vias V2 extend in Z-axis to connect the second level metal layer M2 with the third level metal layer M3. The third level metal layer M3 is formed over the second level metal layer M2, and is electrically connected with the second level metal layer M2 through the second vias V2. In the present embodiment, the third level metal layer M3 include the first bit-line BL-A and the first bit-line-bar BL-A-BAR, and the second vias V2 include the via $V_{BL-A}$ and the via $V_{BL-A-BAR}$, wherein the via $V_{BL-A}$ is connected with the first bit-line BL-A, and the via $V_{BL-A-BAR}$ is connected with the first bit-line-bar BL-A-BAR.

As illustrated in FIG. 7, each grouped-cell further includes the fourth level metal layer M4 and a plurality of third vias V3, wherein the third vias V3 extend in Z-axis to connect the third level metal layer M3 with the fourth level metal layer M4. The fourth level metal layer M4 is formed over the third level metal layer M3, and is electrically connected with the third level metal layer M3 through the third vias V3. In the present embodiment, the fourth level metal layer M4 includes the second word-lines WL-B, and the third vias V3 include a plurality of the vias $V_{WL-B}$, wherein one of the vias $V_{WL-B}$ is connected with one of the second word-lines WL-B, and another of the vias $V_{WL-B}$ is connected with another of the second word-lines WL-B.

As illustrated in FIG. 8, each grouped-cell further includes the fifth level metal layer M5 and a plurality of fourth vias V4, wherein the fourth vias V4 extend in Z-axis to connect the fourth level metal layer M4 with the fifth level metal layer M5. The fifth level metal layer M5 is formed over the fourth level metal layer M4, and is electrically connected with the fourth level metal layer M4 through the fourth vias V4.

As illustrated in FIG. 9, each grouped-cell further includes the sixth level metal layer M6 and a plurality of fifth vias V5, wherein the fifth vias V5 extend in Z-axis to connect the fifth level metal layer M5 with the sixth level metal layer M6. The sixth level metal layer M6 is formed over the fifth level metal layer M5, and is electrically connected with the fifth level metal layer M5 through the fifth vias V5. In the present embodiment, the sixth level metal layer M6 includes the first word-lines WL-A, and the fifth vias V5 include a plurality of the vias $V_{WL-A}$, wherein one of the vias $V_{WL-A}$ is connected with one of the first word-lines WL-A, and another of the vias $V_{WL-A}$ is connected with another of the first word-lines WL-A.

Figure 10:
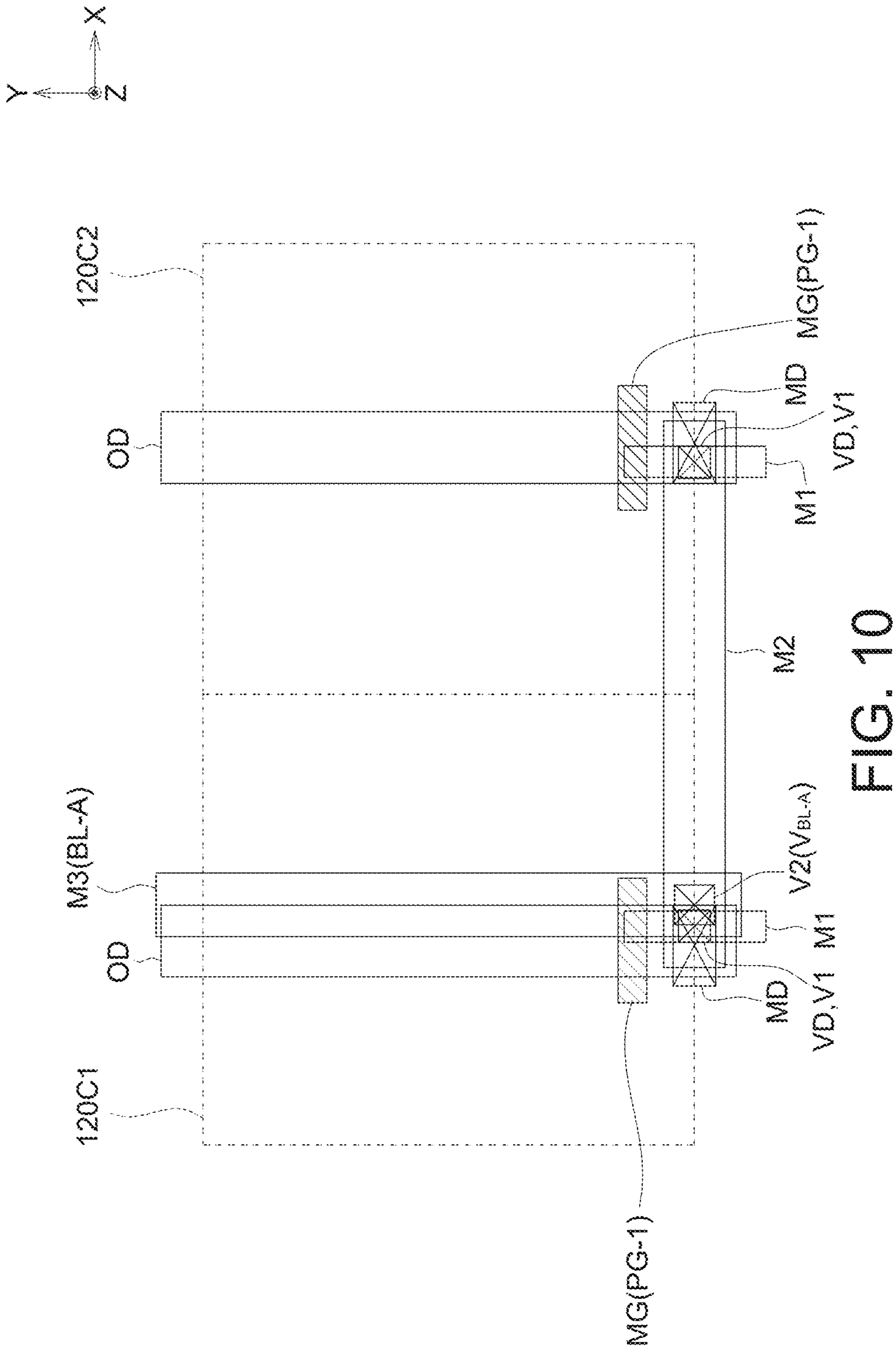
FIG. 10 illustrates a schematic diagram of the first pass-gate device PG-1 of the first dual-port memory cell 120C1 and the first pass-gate device PG-1 of the second dual-port memory cell 120C2 being connected with the first bit-line BL-A in FIGS. 1 and 2.

Referring to FIG. 10, FIG. 10 illustrates a schematic diagram of the first pass-gate device PG-1 of the first dual-port memory cell 120C1 and the first pass-gate device PG-1 of the second dual-port memory cell 120C2 being connected with the first bit-line BL-A in FIGS. 1 and 2. In the first dual-port memory cell 120C1, the drain of the first pass-gate device PG-1 may be connected with the first bit-line BL-A (in the third level metal layer M3) through the diffusion metal MD, the epitaxy via VD, the first level metal layer M1, the first via V1, the second level metal layer M2 and the via $V_{BL-A}$ (the second via V2) in order. In the second dual-port memory cell 120C2, the drain of the first pass-gate device PG-1 may be connected with the first bit-line BL-A (in the third level metal layer M3) through the diffusion metal MD, the epitaxy via VD, the first level metal layer M1, the first via V1, the second level metal layer M2 and the via $V_{BL-A}$ (the second via V2) in order. In the present embodiment, the first pass-gate devices PG-1 of the first dual-port memory cell 120C1 and the second dual-port memory cell 120C2 share a portion of the second level metal layer M2, the via $V_{BL-A}$ (the second via V2) and the first bit-line BL-A.

Figure 11:
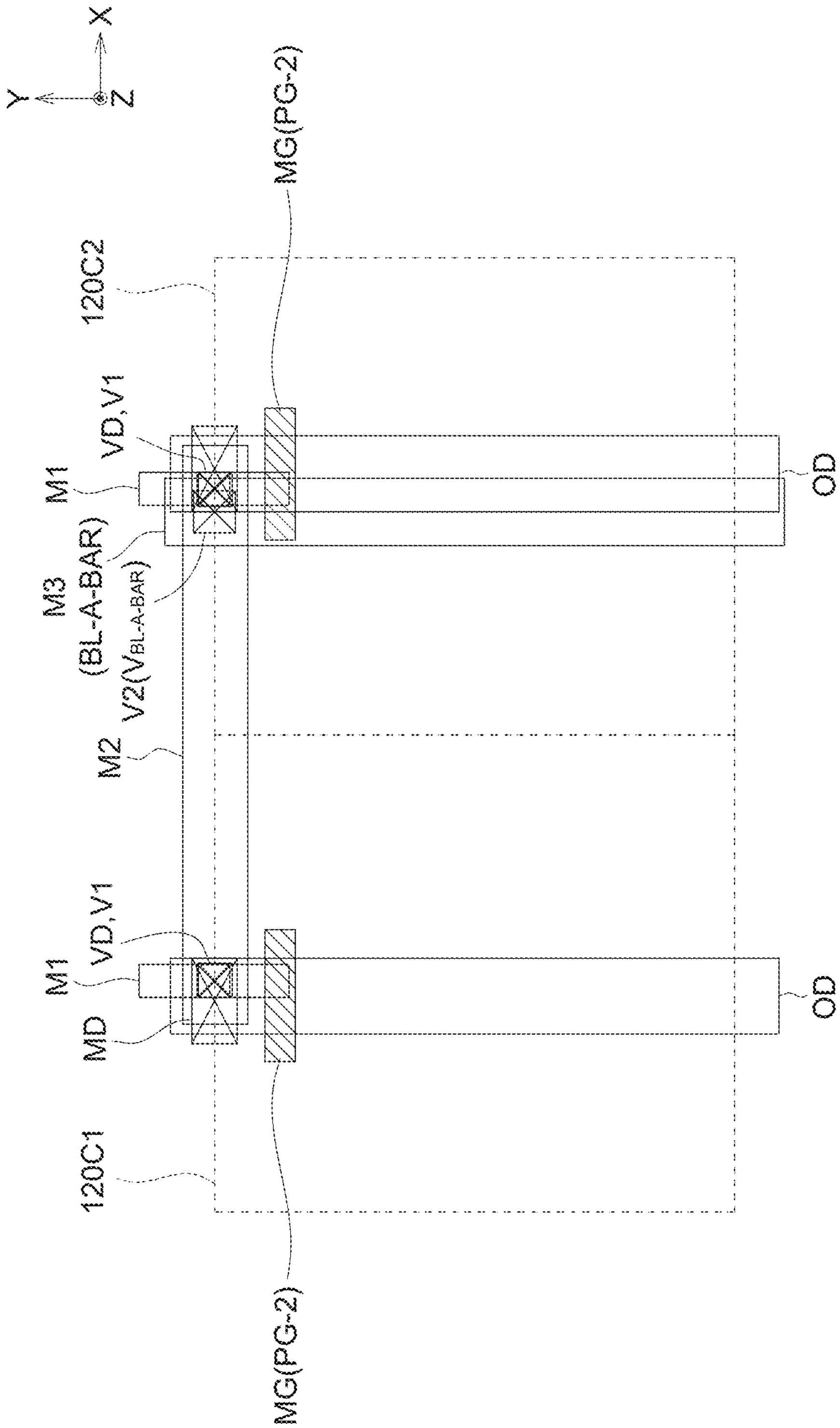
FIG. 11 illustrates a schematic diagram of the second pass-gate device PG-2 of the first dual-port memory cell 120C1 and the second pass-gate device PG-2 of the second dual-port memory cell 120C2 being connected with the first bit-line-bar BL-A-BAR in FIGS. 1 and 2.

Referring to FIG. 11, FIG. 11 illustrates a schematic diagram of the second pass-gate device PG-2 of the first dual-port memory cell 120C1 and the second pass-gate device PG-2 of the second dual-port memory cell 120C2 being connected with the first bit-line-bar BL-A-BAR in FIGS. 1 and 2. In the first dual-port memory cell 120C1, the drain of the second pass-gate device PG-2 may be connected with the first bit-line-bar BL-A-BAR (in the third level metal layer M3) through the diffusion metal MD, the epitaxy via VD, the first level metal layer M1, the first via V1, the second level metal layer M2 and the via $V_{BL-A-BAR}$ (the second via V2) in order. In the second dual-port memory cell 120C2, the drain of the second pass-gate device PG-2 may be connected with the first bit-line-bar BL-A-BAR (in the third level metal layer M3) through the diffusion metal MD, the epitaxy via VD, the first level metal layer M1, the first via V1, the second level metal layer M2 and the via $V_{BL-A}$ (the second via V2) in order. In the present embodiment, the second pass-gate devices PG-2 of the first dual-port memory cell 120C1 and the second dual-port memory cell 120C2 share the first bit-line-bar BL-A-BAR share a portion of the second level metal layer M2, the via $V_{BL-A}$ (the second via V2) and the first bit-line-bar BL-A-BAR.

Figure 12:
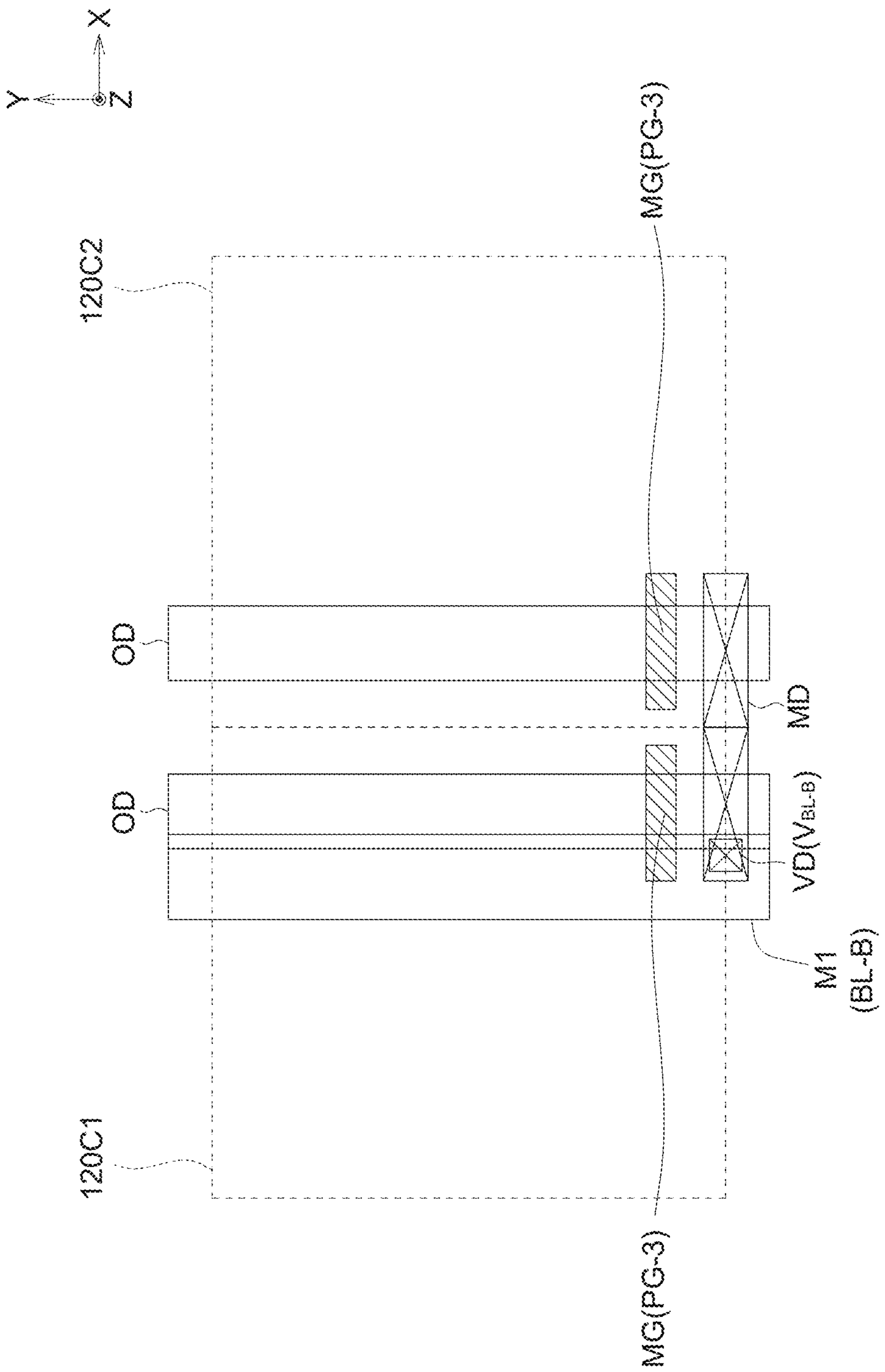
FIG. 12 illustrates a schematic diagram of the third pass-gate device PG-3 of the first dual-port memory cell 120C1 and the third pass-gate device PG-3 of the second dual-port memory cell 120C2 being connected with the second bit-line BL-B in FIGS. 1 and 2.

Referring to FIG. 12, FIG. 12 illustrates a schematic diagram of the third pass-gate device PG-3 of the first dual-port memory cell 120C1 and the third pass-gate device PG-3 of the second dual-port memory cell 120C2 being connected with the second bit-line BL-B in FIGS. 1 and 2. In the first dual-port memory cell 120C1, the drain of the third pass-gate device PG-3 may be connected with the second bit-line BL-B (in the first level metal layer M1) through the diffusion metal MD and the via $V_{BL-B}$ (the epitaxy via VD) in order. In the second dual-port memory cell 120C2, the drain of the third pass-gate device PG-3 may be connected with the second bit-line BL-B (in the first level metal layer M1) through the diffusion metal MD and the via $V_{BL-B}$ (the epitaxy via VD) in order. In the present embodiment, the third pass-gate devices PG-3 of the first dual-port memory cell 120C1 and the second dual-port memory cell 120C2 share the diffusion metal MD, the via $V_{BL-B}$ (the epitaxy via VD) and the second bit-line BL-B.

Figure 13:
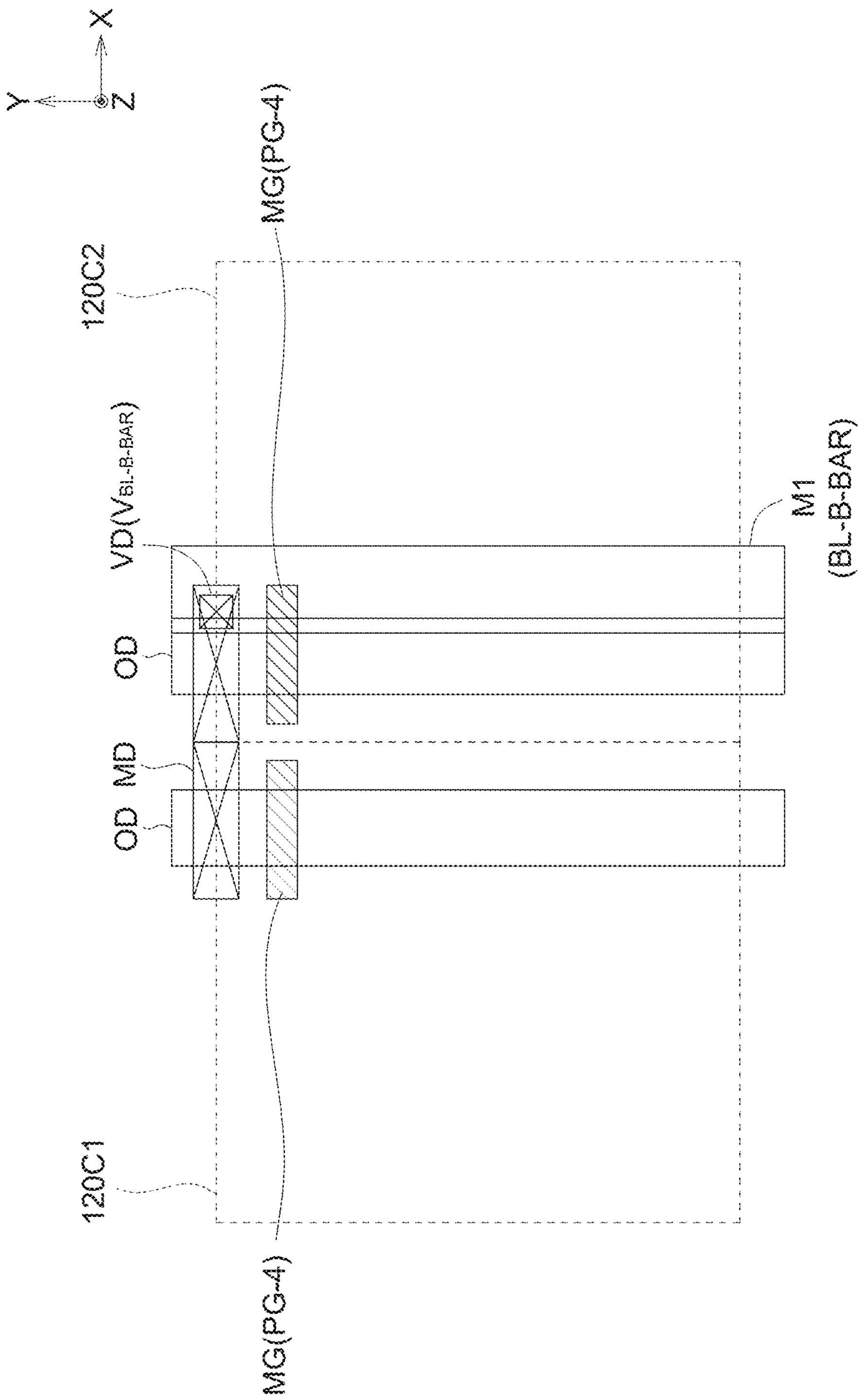
FIG. 13 illustrates a schematic diagram of the fourth pass-gate device PG-4 of the first dual-port memory cell 120C1 and the fourth pass-gate device PG-4 of the second dual-port memory cell 120C2 being connected with the second bit-line-bar BL-B-BAR in FIGS. 1 and 2.

Referring to FIG. 13, FIG. 13 illustrates a schematic diagram of the fourth pass-gate device PG-4 of the first dual-port memory cell 120C1 and the fourth pass-gate device PG-4 of the second dual-port memory cell 120C2 being connected with the second bit-line-bar BL-B-BAR in FIGS. 1 and 2. In the first dual-port memory cell 120C1, the drain of the fourth pass-gate device PG-4 may be connected with the second bit-line-bar BL-B-BAR (in the first level metal layer M1) through the diffusion metal MD and the via $V_{BL-B-BAR}$ (the epitaxy via VD) in order. In the second dual-port memory cell 120C2, the drain of the fourth pass-gate device PG-4 may be connected with the second bit-line-bar BL-B-BAR (in the first level metal layer M1) through the diffusion metal MD and the via $V_{BL-B-BAR}$ (the epitaxy via VD) in order. In the present embodiment, the fourth pass-gate devices PG-4 of the first dual-port memory cell 120C1 and the second dual-port memory cell 120C2 share the diffusion metal MD, the via $V_{BL-B-BAR}$ (the epitaxy via VD) and the second bit-line-bar BL-B-BAR.

Figure 14:
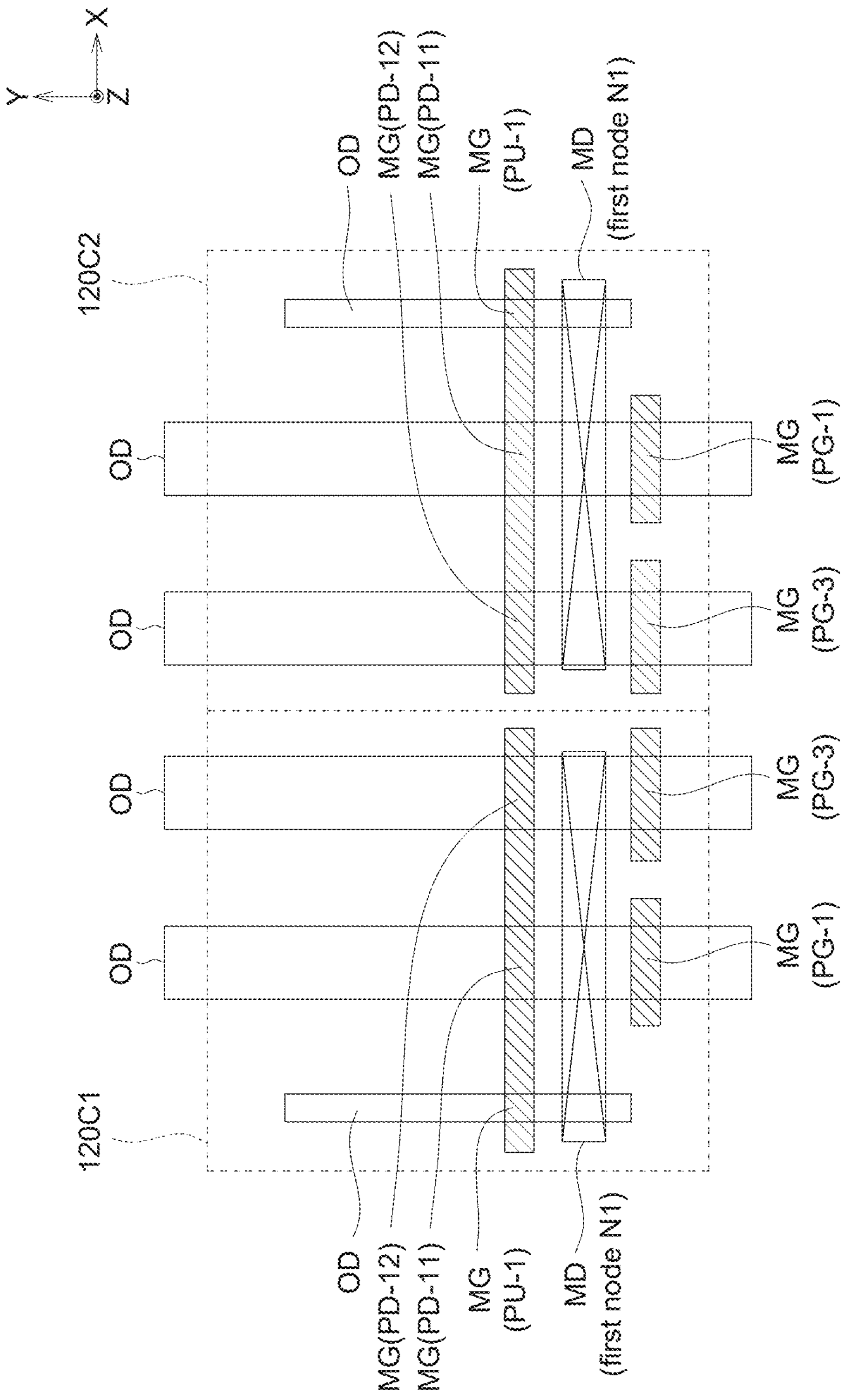
FIG. 14 illustrates a schematic diagram of the first node N1 and a common gate of the first pull-up device PU-1, the first pull-down device PD-11 and the first pull-down device PD-12 in FIGS. 1 and 2.

Referring to FIG. 14, FIG. 14 illustrates a schematic diagram of the first node N1 and a common gate of the first pull-up device PU-1, the first pull-down device PD-11 and the second pull-down device PD-12 in FIGS. 1 and 2. In the first dual-port memory cell 120C1, the drain of the first pull-up device PU-1, the drain of the first pull-down device PD-11, the drain of the second pull-down device PD-12, the source of the first pass-gate device PG-1 and the source of the third pass-gate device PG-3 may share the diffusion metal MD (for example, the first node N1). The first pull-up device PU-1, the first pull-down device PD-11 and the second pull-down device PD-12 may share the same metal gate MG (the common gate) in order. In the second dual-port memory cell 120C2, the drain of the first pull-up device PU-1, the drain of the first pull-down device PD-11, the drain of the second pull-down device PD-12, the source of the first pass-gate device PG-1 and the source of the third pass-gate device PG-3 may share the diffusion metal MD (for example, the first node N1). The first pull-up device PU-1, the first pull-down device PD-11 and the second pull-down device PD-12 may share the same metal gate MG (the common gate) in order.

Figure 15:
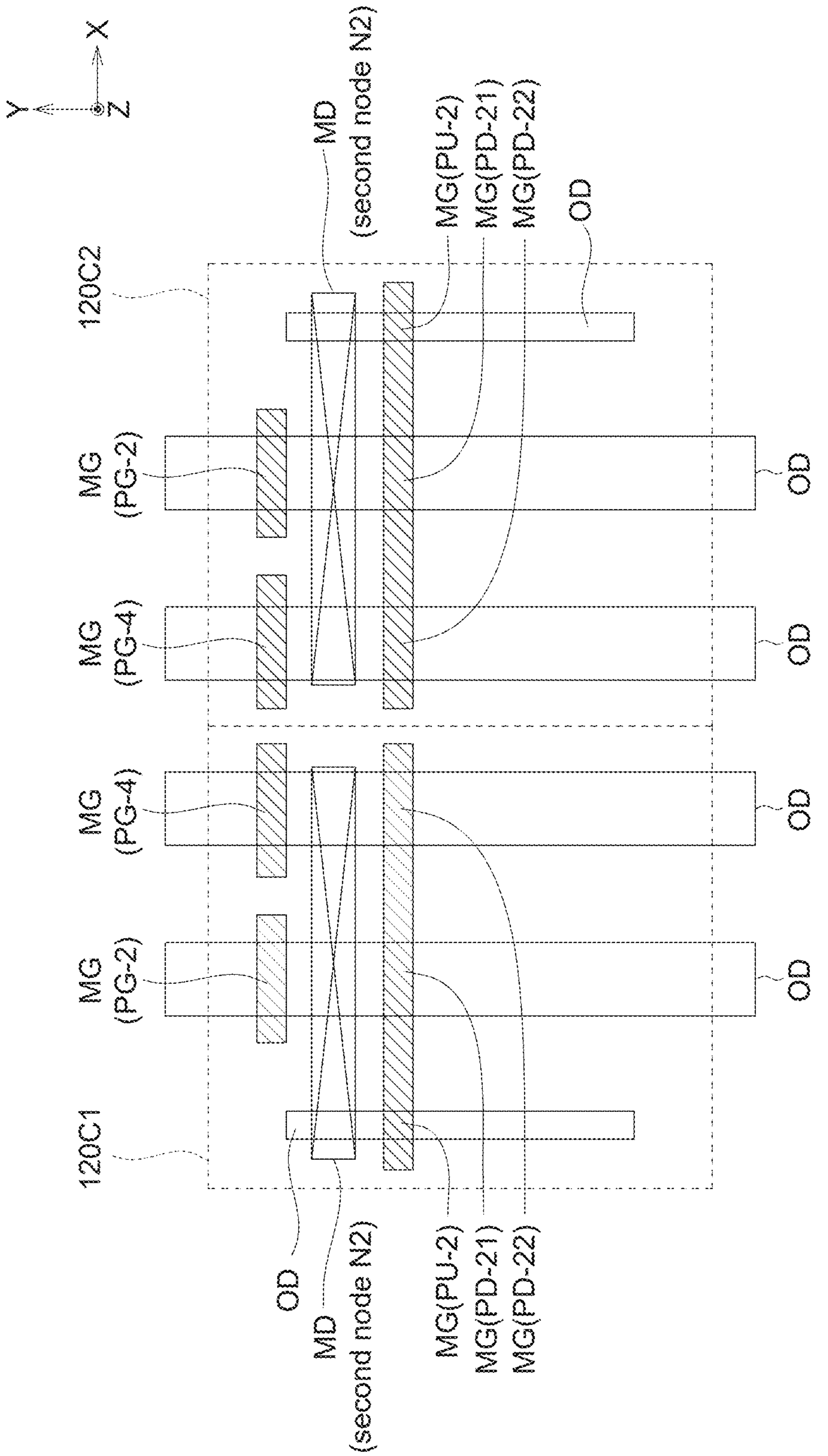
FIG. 15 illustrates a schematic diagram of the second node N2 and a common gate of the second pull-up device PU-2, the third pull-down device PD-21 and the fourth pull-down device PD-22 in FIGS. 1 and 2.

Referring to FIG. 15, FIG. 15 illustrates a schematic diagram of the second node N2 and a common gate of the second pull-up device PU-2, the third pull-down device PD-21 and the fourth pull-down device PD-22 in FIGS. 1 and 2. In the first dual-port memory cell 120C1, the drain of the second pull-up device PU-2, the drain of the third pull-down device PD-21, the drain of the fourth pull-down device PD-22, the source of the second pass-gate device PG-2 and the source of the fourth pass-gate device PG-4 may share the diffusion metal MD (for example, the second node N2). The second pull-up device PU-2, the third pull-down device PD-21 and the fourth pull-down device PD-22 may share the same metal gate MG (the common gate) in order. In the second dual-port memory cell 120C2, the drain of the second pull-up device PU-2, the drain of the third pull-down device PD-21, the drain of the fourth pull-down device PD-22, the source of the second pass-gate device PG-2 and the source of the fourth pass-gate device PG-4 may share the diffusion metal MD (for example, the second node N2) in order. The second pull-up device PU-2, the third pull-down device PD-21 and the fourth pull-down device PD-22 may share the same metal gate MG (the common gate).

Figure 16:
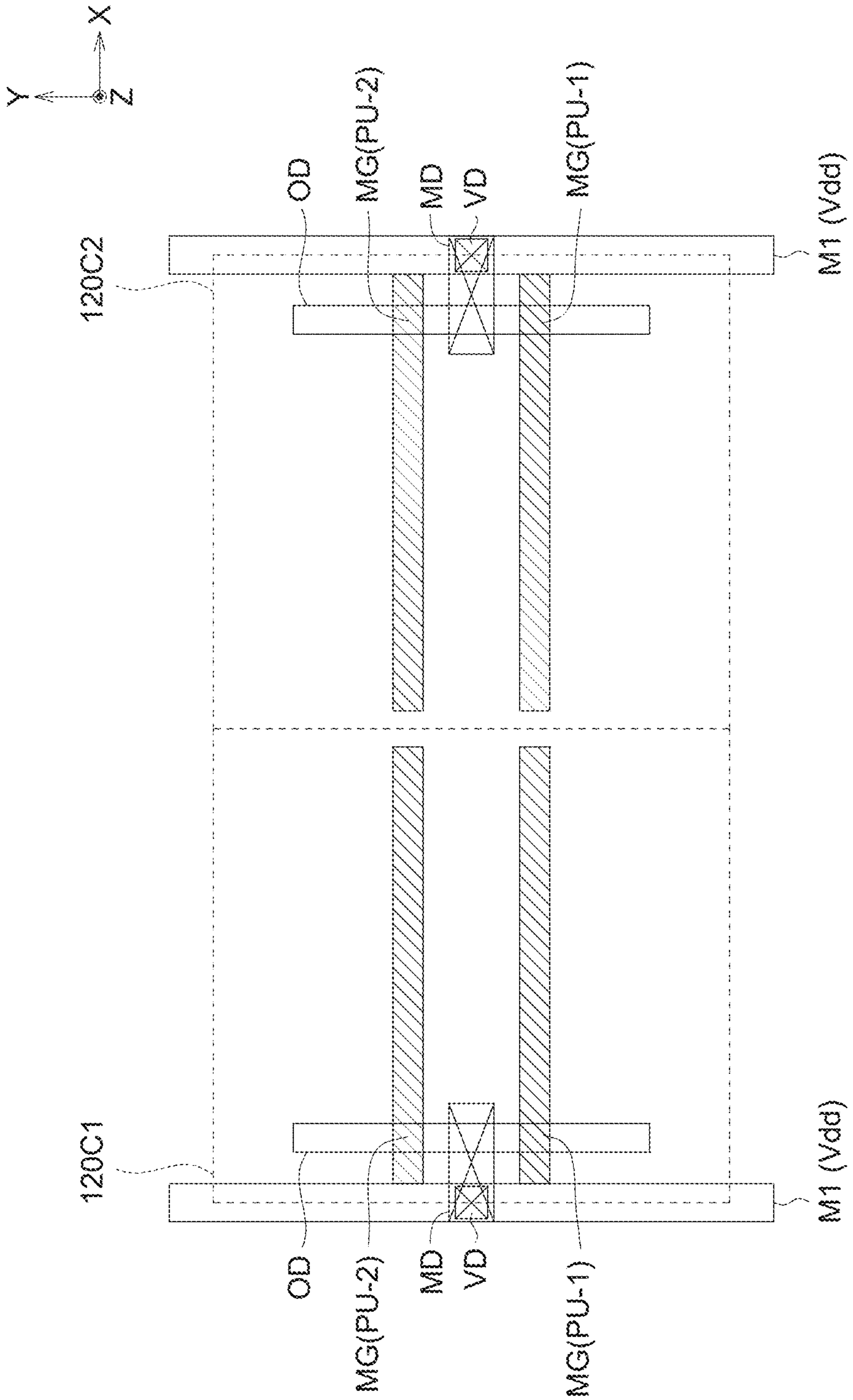
FIG. 16 illustrates a schematic diagram of the source of the first pull-up device PU-1 and the source of the second pull-up device PU-2 being electrically connected with the power line $V_{dd}$ in FIGS. 1 and 2.

Referring to FIG. 16, FIG. 16 illustrates a schematic diagram of the source of the first pull-up device PU-1 and the source of the second pull-up device PU-2 being electrically connected with the power line $V_{dd}$ in FIGS. 1 and 2. In the first dual-port memory cell 120C1, the source of the first pull-up device PU-1 and the source of the second pull-up device PU-2 may be electrically connected with the power line $V_{dd}$ (in the first level metal layer M1) through the diffusion metal MD and the epitaxy via VD in order. In the second dual-port memory cell 120C2, the source of the first pull-up device PU-1 and the source of the second pull-up device PU-2 may be electrically connected with the power line $V_{dd}$ (in the first level metal layer M1) through the diffusion metal MD and the epitaxy via VD in order.

Figure 17:
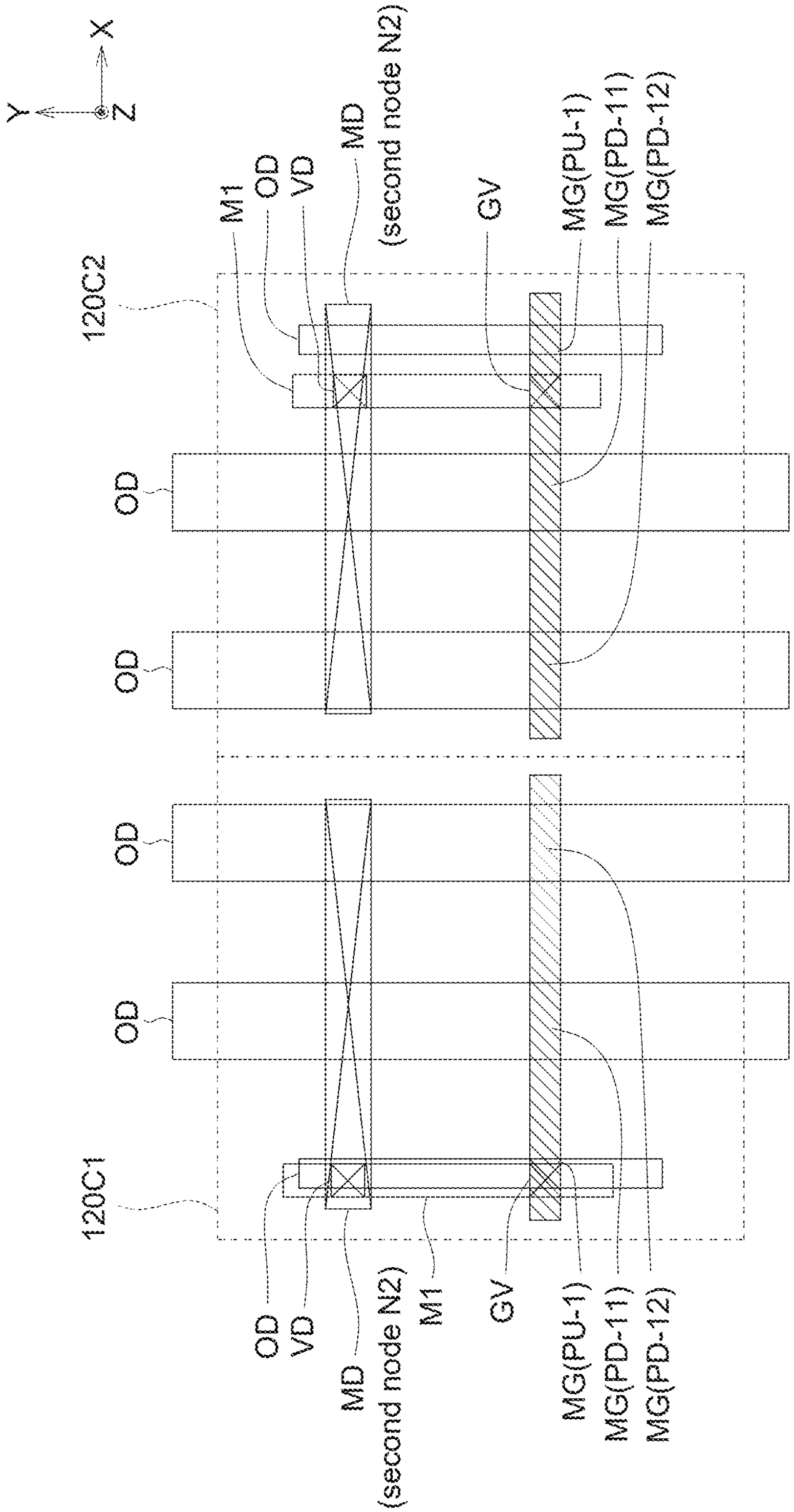
FIG. 17 illustrates a schematic diagram of the gate of the first pull-up device PU-1, the gate of the first pull-down device PD-11 and the gate of the first pull-down device PD-12 being electrically connected with the second node N2 in FIGS. 1 and 2.

Referring to FIG. 17, FIG. 17 illustrates a schematic diagram of the gate of the first pull-up device PU-1, the gate of the first pull-down device PD-11 and the gate of the second pull-down device PD-12 being electrically connected with the second node N2 in FIGS. 1 and 2. In the first dual-port memory cell 120C1, the gate of the first pull-up device PU-1, the gate of the first pull-down device PD-11 and the gate of second first pull-down device PD-12 may be electrically connected with the second node N2 through the gate via GV, the first level metal layer M1 and the epitaxy via VD in order. In the second dual-port memory cell 120C2, the gate of the first pull-up device PU-1, the gate of the first pull-down device PD-11 and the gate of the second pull-down device PD-12 may be electrically connected with the second node N2 through the gate via GV, the first level metal layer M1 and the epitaxy via VD in order.

Figure 18:
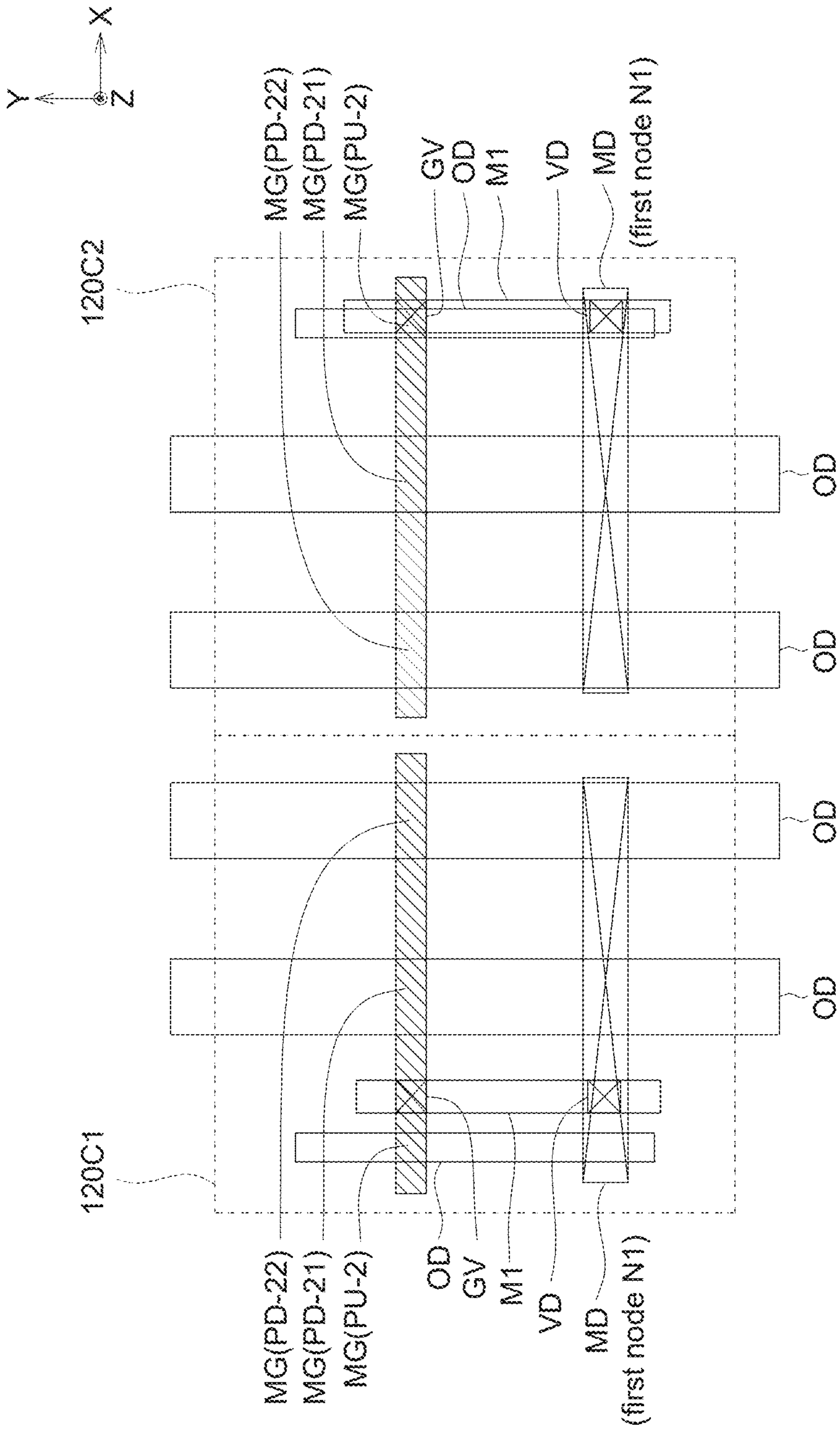
FIG. 18 illustrates a schematic diagram of the gate of the second pull-up device PU-2, the gate of the third pull-down device PD-21 and the gate of the fourth pull-down device PD-22 being electrically connected with the first node N1 in FIGS. 1 and 2.

Referring to FIG. 18, FIG. 18 illustrates a schematic diagram of the gate of the second pull-up device PU-2, the gate of the third pull-down device PD-21 and the gate of the fourth pull-down device PD-22 being electrically connected with the first node N1 in FIGS. 1 and 2. In the first dual-port memory cell 120C1, the gate of the second pull-up device PU-2, the gate of the third pull-down device PD-21 and the gate of the fourth pull-down device PD-22 may be electrically connected with the first node N1 through the gate via GV, the first level metal layer M1 and the epitaxy via VD in order. In the second dual-port memory cell 120C2, the gate of the second pull-up device PU-2, the gate of the third pull-down device PD-21 and the gate of the fourth pull-down device PD-22 may be electrically connected with the second node N2 through the gate via GV, the first level metal layer M1 and the epitaxy via VD in order.

Figure 19:
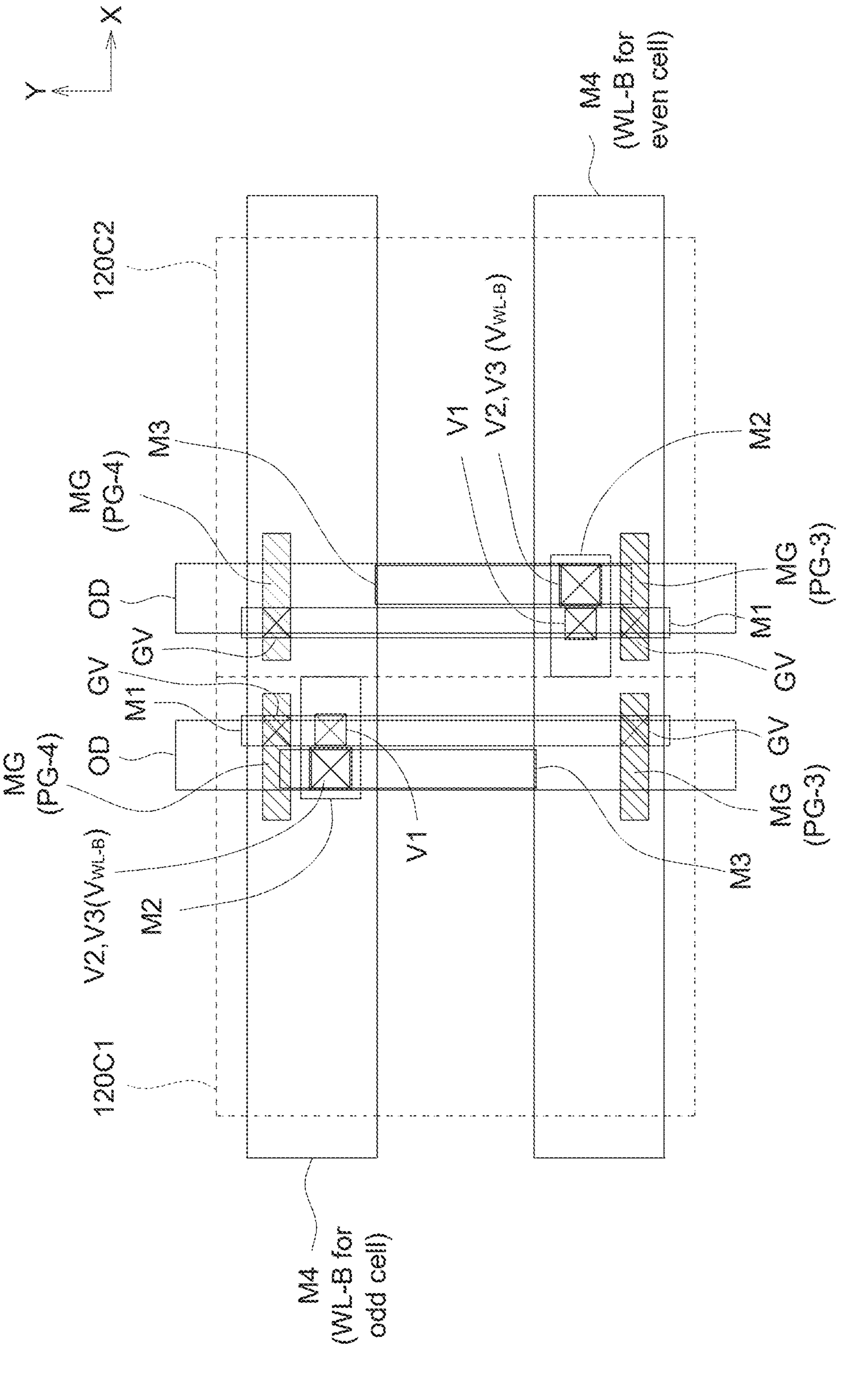
FIG. 19 illustrates a schematic diagram of the gate of the third pass-gate device PG-3 and the gate of the fourth pass-gate device PG-4 being electrically connected with the second word-lines WL-B in FIGS. 1 and 2.

Referring to FIG. 19, FIG. 19 illustrates a schematic diagram of the gate of the third pass-gate device PG-3 and the gate of the fourth pass-gate device PG-4 being electrically connected with the second word-lines WL-B in FIGS. 1 and 2. In the first dual-port memory cell 120C1, the gate of the third pass-gate device PG-3 may be electrically connected with the upper second word-line WL-B (in the fourth level metal layer M4) through the gate via GV, the first level metal layer M1, the first via V1, the second level metal layer M2, the second via V2, the third level metal layer M3 and the via $V_{WL\text{-}B}$ (the third via V3) in order, and the gate of the fourth pass-gate device PG-4 may be electrically connected with the upper second word-line WL-B (in the fourth level metal layer M4) through the gate via GV, the first level metal layer M1, the first via V1, the second level metal layer M2, the second via V2, the third level metal layer M3 and the via $V_{WL\text{-}B}$ (the third via V3) in order. In the second dual-port memory cell 120C2, the gate of the third pass-gate device PG-3 may be electrically connected with the lower second word-line WL-B (in the fourth level metal layer M4) through the gate via GV, the first level metal layer M1, the first via V1, the second level metal layer M2, the second via V2, the third level metal layer M3 and the via $V_{WL\text{-}B}$ (the third via V3) in order, and the gate of the fourth pass-gate device PG-4 may be electrically connected with the lower second word-line WL-B (in the fourth level metal layer M4) through the gate via GV, the first level metal layer M1, the first via V1, the second level metal layer M2, the second via V2, the third level metal layer M3 and the via $V_{WL\text{-}B}$ (the third via V3) in order.

Figure 20:
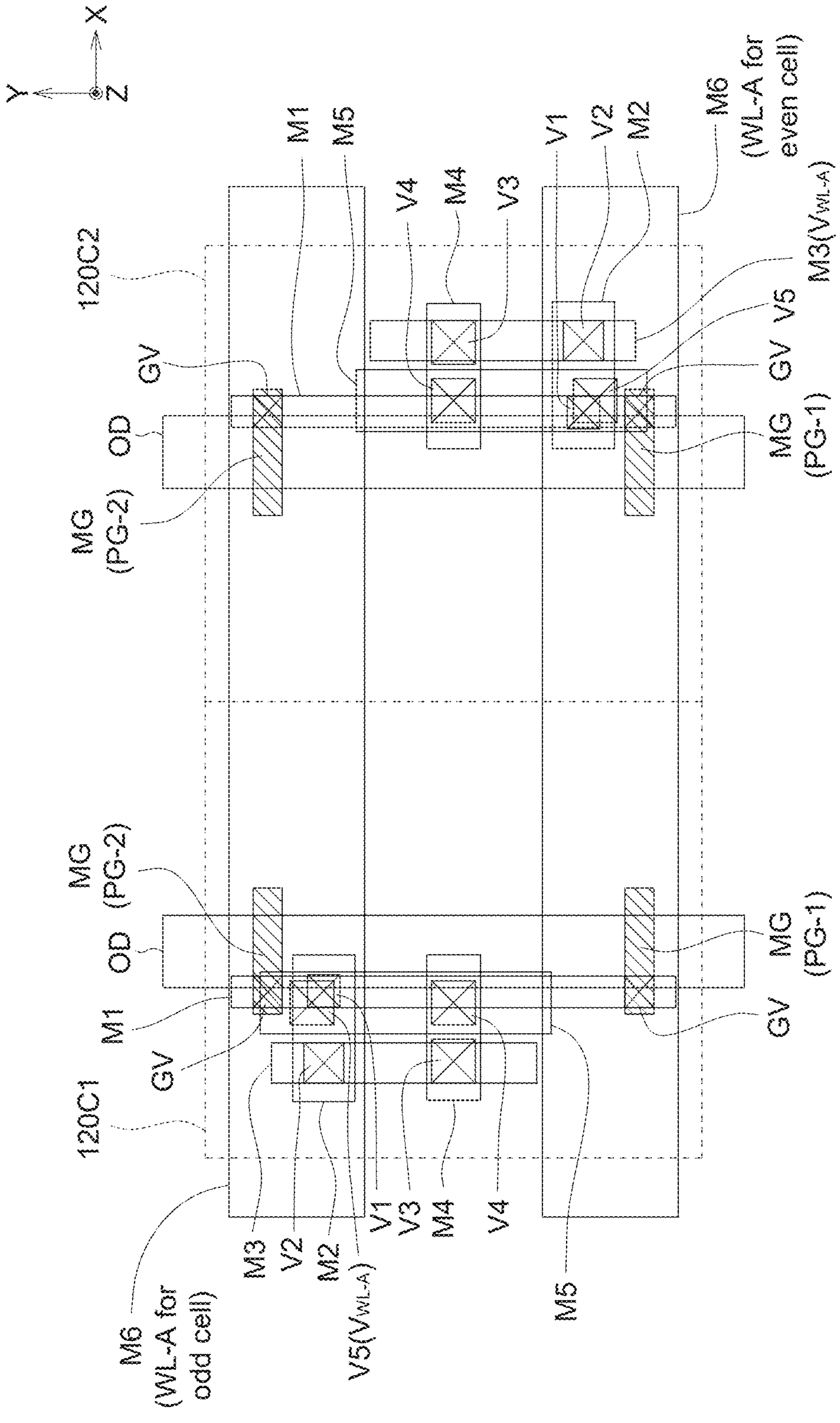
FIG. 20 illustrates a schematic diagram of the gate of the first pass-gate device PG-1 and the gate of the second pass-gate device PG-2 being electrically connected with the first word-lines WL-A in FIGS. 1 and 2.

Referring to FIG. 20, FIG. 20 illustrates a schematic diagram of the gate of the first pass-gate device PG-1 and the gate of the second pass-gate device PG-2 being electrically connected with the first word-lines WL-A in FIGS. 1 and 2. In the first dual-port memory cell 120C1, the gate of the first pass-gate device PG-1 may be electrically connected with the upper first word-line WL-A (in the sixth level metal layer M6) through the gate via GV, the first level metal layer M1, the first via V1, the second level metal layer M2, the second via V2, the third level metal layer M3, the fourth via V4, the fourth level metal layer M4 and the via $V_{WL\text{-}A}$ (the fifth via V5) in order, and the gate of the second pass-gate device PG-2 may be electrically connected with the upper first word-line WL-A (in the sixth level metal layer M6) through the gate via GV, the first level metal layer M1, the first via V1, the second level metal layer M2, the second via V2, the third level metal layer M3, the fourth via V4, the fourth level metal layer M4 and the via $V_{WL\text{-}A}$ (the fifth via V5). In the second dual-port memory cell 120C2, the gate of the first pass-gate device PG-1 may be electrically connected with the lower first word-line WL-A (in the sixth level metal layer M6) through the gate via GV, the first level metal layer M1, the first via V1, the second level metal layer M2, the second via V2, the third level metal layer M3, the fourth via V4, the fourth level metal layer M4 and the via $V_{WL\text{-}A}$ (the fifth via V5) in order, and the gate of the second pass-gate device PG-2 may be electrically connected with the lower upper first word-line WL-A (in the sixth level metal layer M6) through the gate via GV, the first level metal layer M1, the first via V1, the second level metal layer M2, the second via V2, the third level metal layer M3, the fourth via V4, the fourth level metal layer M4 and the via $V_{WL\text{-}A}$ (the fifth via V5) in order.

Figure 21:
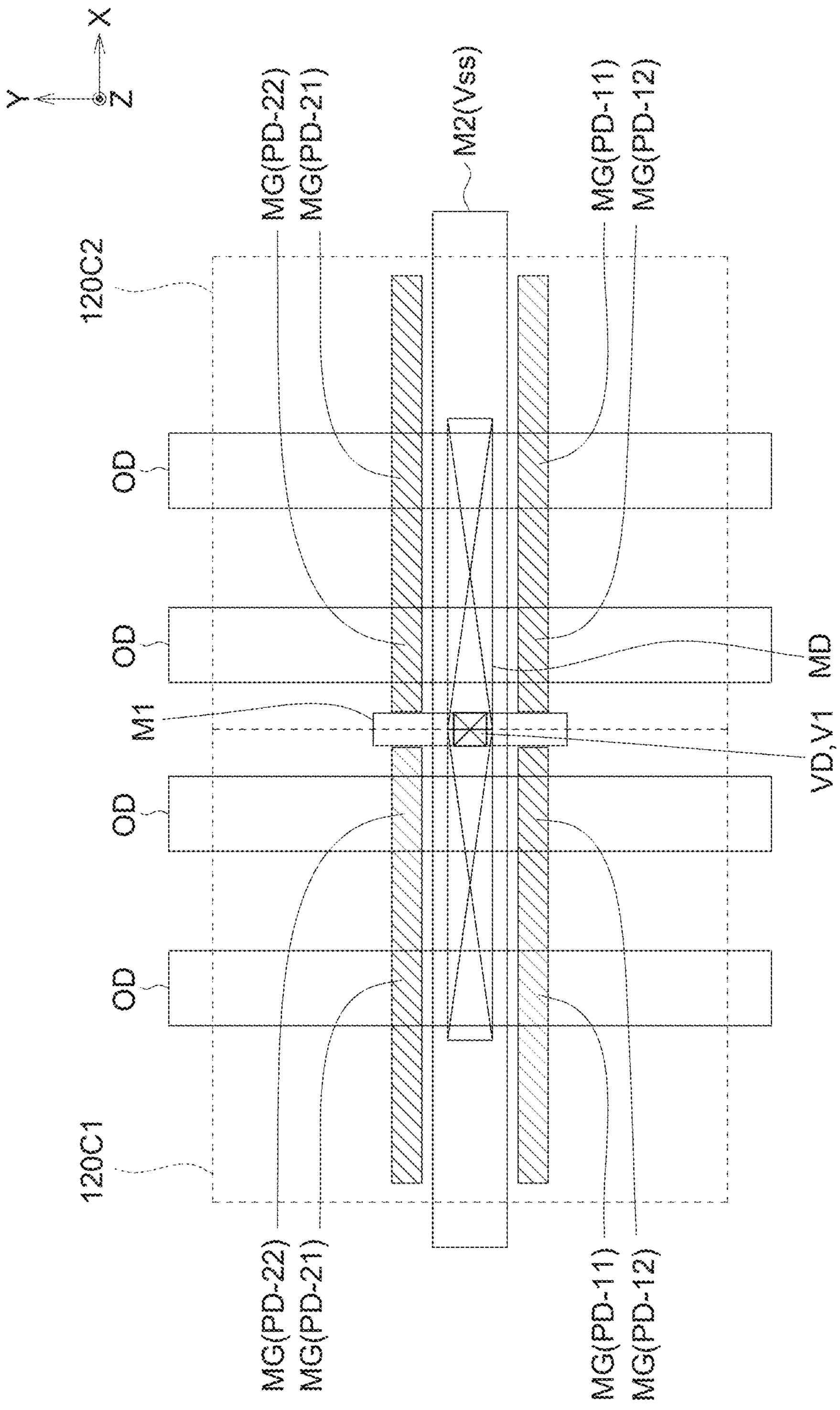
FIG. 21 illustrates a schematic diagram of the source of the first pull-down device PD-11, the source of the first pull-down device PD-12, the source of the third pull-down device PD-21 and the source of the fourth pull-down device PD-22 being electrically connected with the power line $V_{SS}$ in FIGS. 1 and 2.

Referring to FIG. 21, FIG. 21 illustrates a schematic diagram of the source of the first pull-down device PD-11, the source of the second pull-down device PD-12, the source of the third pull-down device PD-21 and the source of the fourth pull-down device PD-22 being electrically connected with the power line $V_{SS}$ in FIGS. 1 and 2. The first pull-down device PD-11, the second pull-down device PD-12, the third pull-down device PD-21 and the fourth pull-down device PD-22 of the first dual-port memory cell 120C1 and the first pull-down device PD-11, the second pull-down device PD-12, the third pull-down device PD-21 and the fourth pull-down device PD-22 of the second dual-port memory cell 120C2 may share the diffusion metal MD. In the first dual-port memory cell 120C1, the source of the first pull-down device PD-11, the source of the second pull-down device PD-12, the source of the third pull-down device PD-21 and the source of the fourth pull-down device PD-22 may be electrically connected with the power line $V_{SS}$ (in the second level metal layer M2) through the diffusion metal MD, the epitaxy via VD, the first level metal layer M1 and the first via V1 in order. In the second dual-port memory cell 120C2, the source of the first pull-down device PD-11, the source of the second pull-down device PD-12, the source of the third pull-down device PD-21 and the source of the fourth pull-down device PD-22 may be electrically connected with the power line $V_{SS}$ (in the second level metal layer M2) through the diffusion metal MD, the epitaxy via VD, the first level metal layer M1 and the first via V1 in order. Due to the source of the first pull-down device PD-11, the source of the second pull-down device PD-12, the source of the third pull-down device PD-21 and the source of the fourth pull-down device PD-22 sharing the same diffusion metal MD, there is no potential difference among the source of the first pull-down device PD-11, the source of the second pull-down device PD-12, the source of the third pull-down device PD-21 and the source of the fourth pull-down device PD-22.

Figure 22:
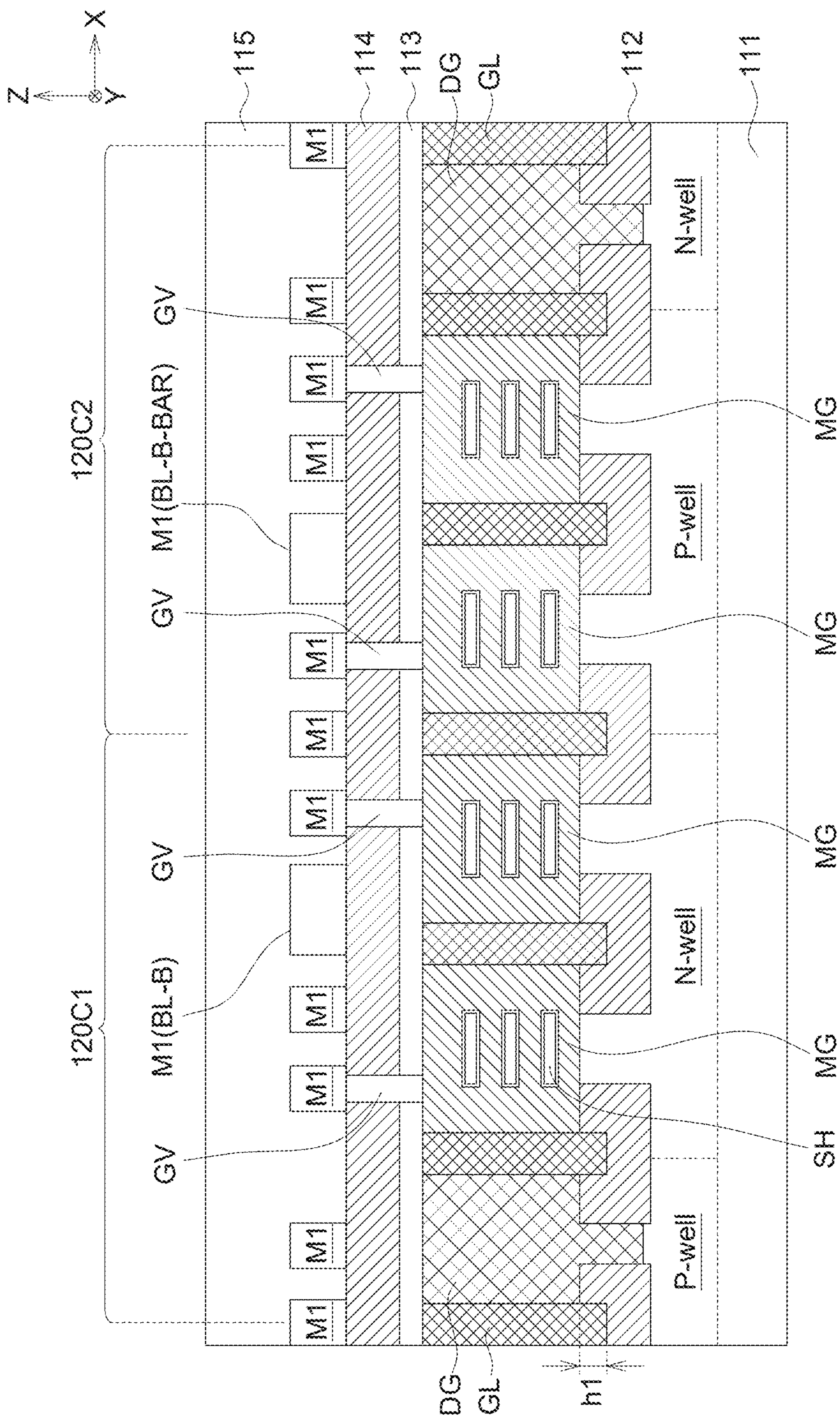
FIG. 22 illustrates a schematic diagram of a cross-sectional view of the structure in FIG. 4 in a direction 22-22'.

Referring to FIG. 22, FIG. 22 illustrates a schematic diagram of a cross-sectional view of the structure in FIG. 4 in a direction 22-22'.

As illustrated in FIG. 22, the dual-port memory structure 100 further includes a substrate 111, at least one isolation layer 112, a gate top dielectric layer 113, a first dielectric layer 114 and a second dielectric layer 115. The substrate 111 is, for example, a portion of a silicon wafer. The isolation layer 112 is, for example, STI (Shallow Trench Isolation) and within the substrate 111 for separating two adjacent devices. The gate top dielectric layer 113 is formed over the gates of the devices, the gate end dielectric layer lines GL and the dielectric gates DG. The first dielectric layer 114 is formed over the gate top dielectric layer 113. The gate vias GV are electrically connected with the gates (the metal gate MG) of the devices through the first dielectric layer 114 and the gate top dielectric layer 113. In an embodiment, the first dielectric layer 114 is, for example, an ILD layer (interlayer dielectric). The first level metal layer M1 is formed over the first dielectric layer 114 and electrically connected with the gates of the devices through the gate vias GV. The second dielectric layer 115 is formed over the first level metal layer M1 and the first dielectric layer 114. In an embodiment, the second dielectric layer 115 is, for example, an IMD (inter-metal dielectric). In addition, the gate end dielectric layer lines GL is a dielectric line and have a depth h1 that extends into the isolation layer 112 within the substrate 111 in a range of 5 nanometers (nm) to 60 nm.

As illustrated in FIG. 22, each device further include a plurality of active sheets SH which are stacked in Z-axis. The active sheets SH are surrounded by the metal gate of the corresponding device, and such structure may be called "GAA (Gate-all-around)".

Figure 23:
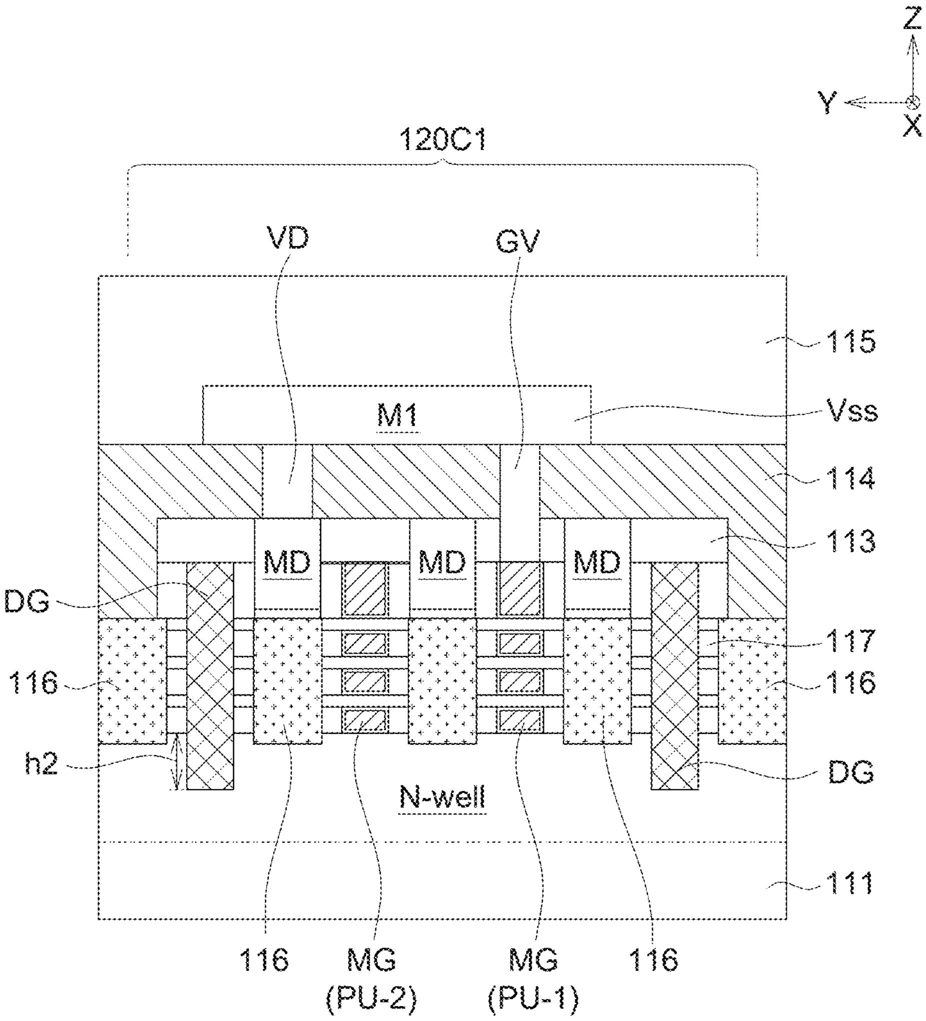
FIG. 23 illustrates a schematic diagram of a cross-sectional view of the structure in FIG. 4 in a direction 23-23'.

Referring to FIG. 23, FIG. 23 illustrates a schematic diagram of a cross-sectional view of the structure in FIG. 4 in a direction 23-23'.

As illustrated in FIG. 23, the dual-port memory structure 100 further includes a plurality of epitaxies 116 and a plurality of inner spacer 117. Two epitaxies 116 may be located at two opposite sides of the gate (the metal gate MG) of the corresponding device. The diffusion metal MD is formed on the epitaxies 116. The gate top dielectric layer 113 is formed on the gates of the devices, the gate end dielectric layer lines GL and the dielectric gates DG. The first dielectric layer 114 is formed over the gate top dielectric layer 113 and the diffusion metal MD. The epitaxy via VD is electrically connected with the corresponding diffusion metal MD through the first dielectric layer 114. The gate via GV is electrically connected with the gate of the corresponding device through the first dielectric layer 114 and the gate top dielectric layer 113. The inner spacers 117 are formed on opposite two lateral surfaces of the gate of the corresponding device. The inner spacers 117 may be formed of a dielectric material.

As illustrated in FIG. 23, a geta region may be removed to form a recess and the recess may be filled with dielectric material (it may be single-layered structure or multiple-layered structure with various dielectric material) to form the dielectric gates DG. In addition, the dielectric gates DG may extend into to a well region (for example, N-well) within the substrate 111 by a depth h2 ranging between 15 nm and 150 nm. The dielectric gate DG may isolate the pull-up device and accordingly it may avoid the current leakage (or shorting) of the second pull-up device.

Figure 24:
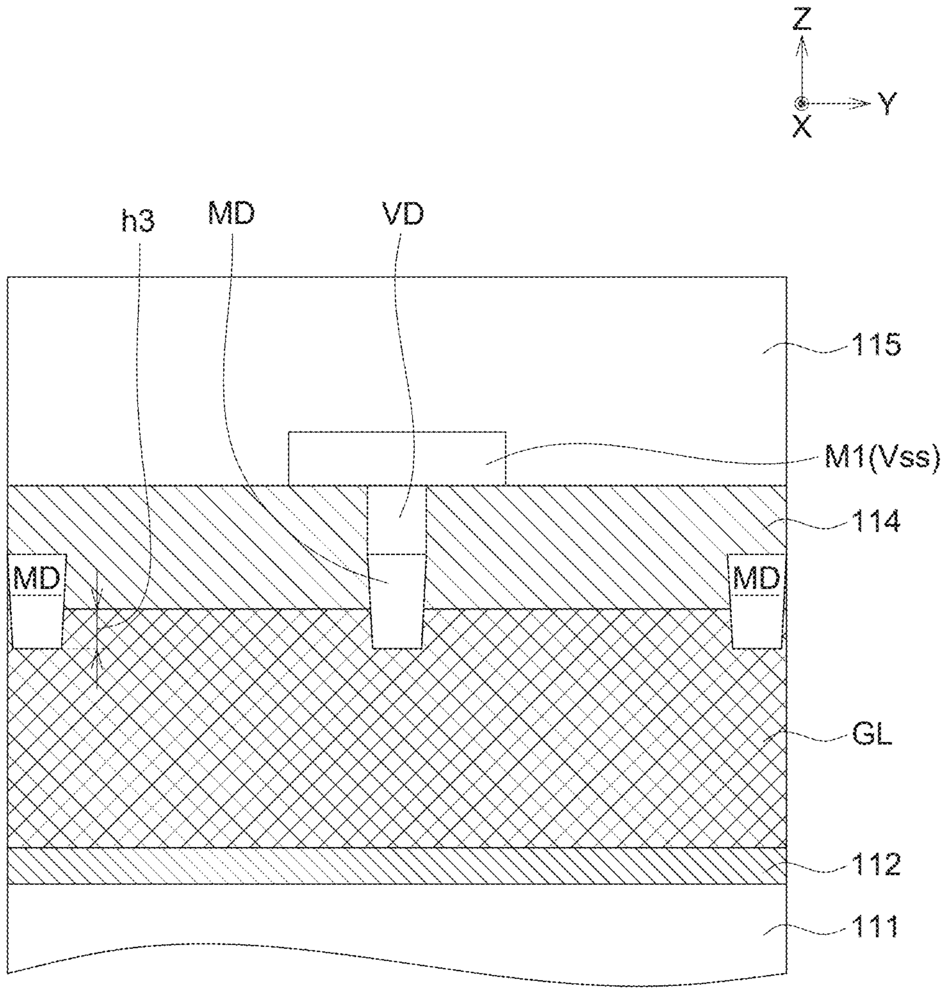
FIG. 24 illustrates a schematic diagram of a cross-sectional view of the structure in FIG. 4 in a direction 24-24'.

Referring to FIG. 24, FIG. 24 illustrates a schematic diagram of a cross-sectional view of the structure in FIG. 4 in a direction 24-24'. The diffusion metals MD may extend into the gate end dielectric layer lines GL by a depth h3 ranging between 3 nm and 50 nm.

Figure 25:
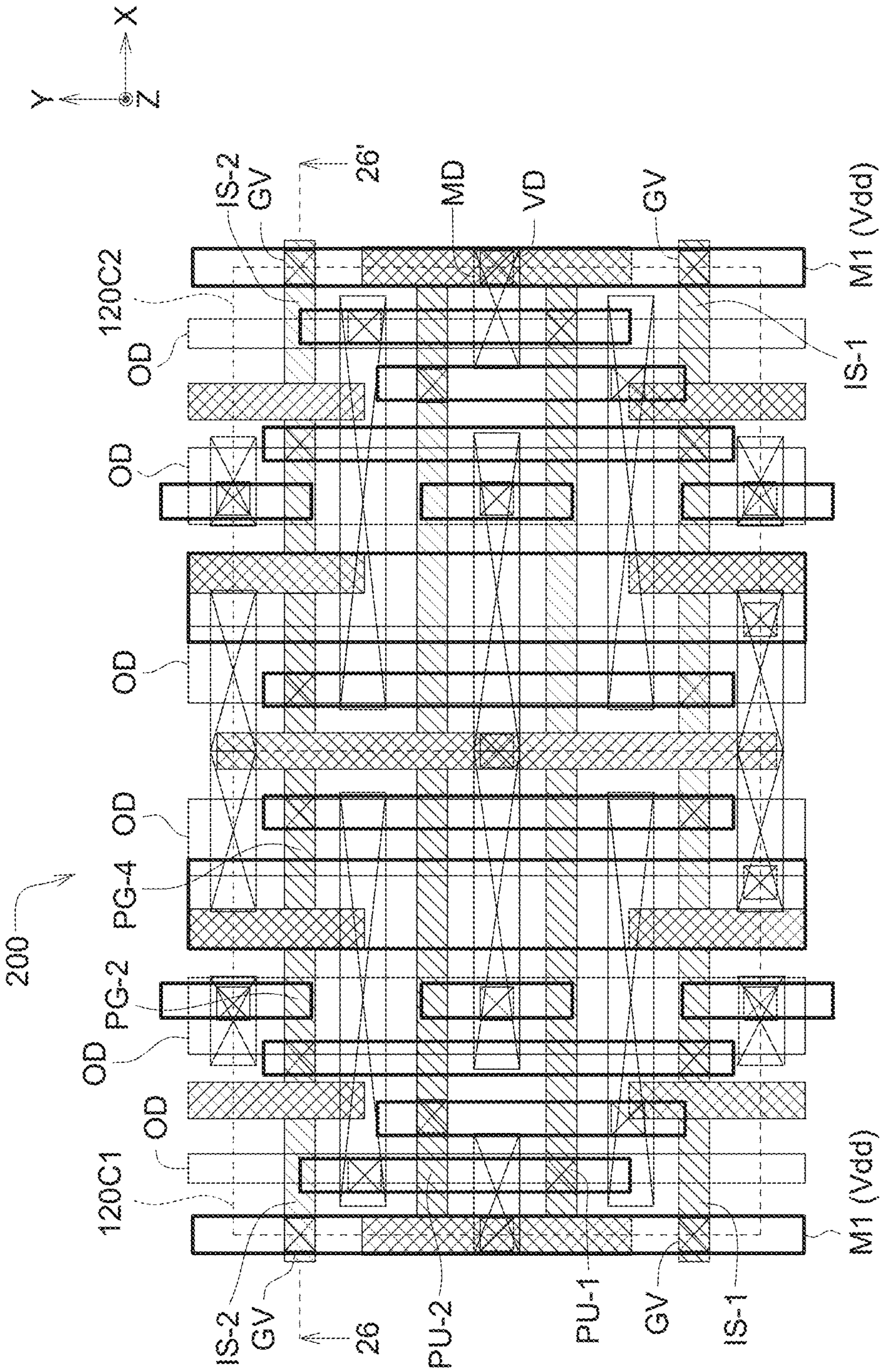
FIG. 25 illustrates a schematic diagram of a circuit of a dual-port memory structure 200 according to another embodiment of the present disclosure.
Figure 26:
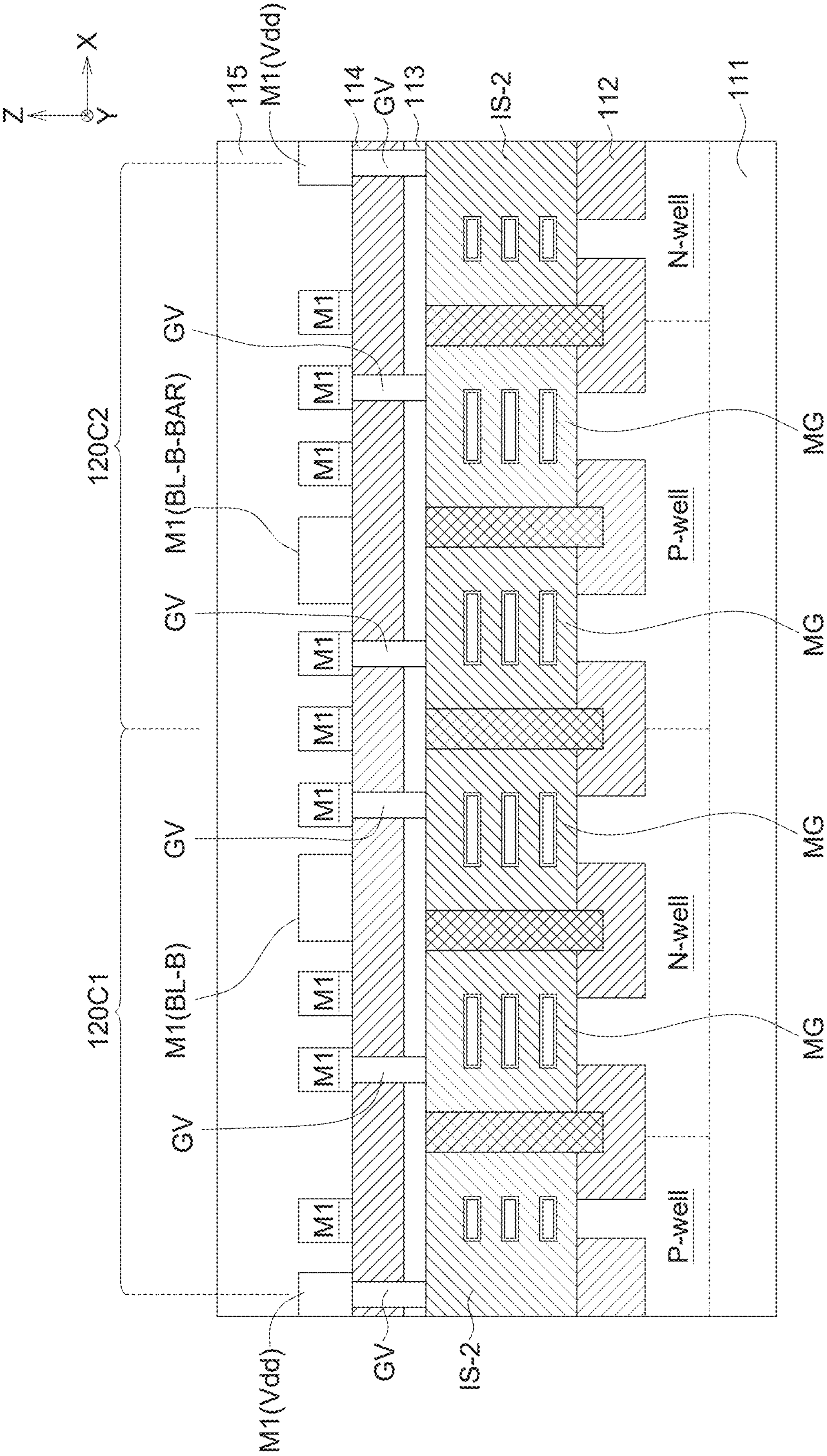
FIG. 26 illustrates a schematic diagram of a cross-sectional view of the dual-port memory structure 200 in FIG. 25.

Referring to FIGS. 25 and 26, FIG. 25 illustrates a schematic diagram of a circuit of a dual-port memory structure 200 according to another embodiment of the present disclosure, and FIG. 26 illustrates a schematic diagram of a cross-sectional view of the dual-port memory structure 200 in FIG. 25.

The dual-port memory structure 200 includes the feature (structure, material, connection relationship, circuit diagram, etc.) the same as or similar to that of the dual-port memory structure 100, and at least one difference is that each of at least one (for example, the first dual-port memory cell 120C1 and the second dual-port memory cell 120C2) of the dual-port memory cells of the dual-port memory structure 200 includes twelve devices, wherein the device is, for example, the transistor. The twelve devices include ten devices (as aforementioned), a first isolation device IS-1 and a second isolation device IS-2. The first isolation device IS-1 and the second isolation device IS-2 replace the dielectric gates DG in each dual-port memory cell.

As illustrated in FIG. 26, the first isolation device IS-1 and/or the second isolation device IS-2 includes the structure the same as or similar to that of the transistor. The gate (the metal gate MG) of the first isolation device IS-1 and/or the gate (the metal gate MG) of the second isolation device IS-2 may be electrically connected with the power line $V_{dd}$ (in the first level metal layer M1) through the gate vias GV. The first isolation device IS-1 may be controlled by the power line $V_{dd}$ to be turned on or turned off, and accordingly it may avoid the current leakage (or shorting) of the first pull-up device PU-1 and/or the second isolation device IS-2 may be controlled by the power line $V_{dd}$ to be turned on or turned off, and accordingly it may avoid the current leakage (or shorting) of the second pull-up device PU-2.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

According to the present disclosure, a dual-port memory structure includes a plurality of grouped-cells, a first bit-line pair and a second bit-line pair. The grouped-cells are in a word-line routing direction, wherein each grouped-cell comprises a plurality of dual-port memory cells adjacently disposed and is placed in the word-line routing direction. The dual-port memory cells of each grouped-cell share the first bit-line pair and the second bit-line pair, and the first bit-line pair and the second bit-line pair are located on different two of a plurality of level metal layer. As a result, it may simplify circuit design of the level metal layers.

Example embodiment 1: a dual-port memory structure includes a plurality of grouped-cells, a first bit-line pair and a second bit-line pair. The grouped-cells are in a word-line routing direction, wherein each grouped-cell comprises a plurality of dual-port memory cells adjacently disposed and is placed in the word-line routing direction. The dual-port memory cells of each grouped-cell share the first bit-line pair and the second bit-line pair, and the first bit-line pair and the second bit-line pair are located on different two of a plurality of level metal layers.

Example embodiment 2 based on Example embodiment 1: the level metal layers comprises a first level metal layer, a second level metal layer and a third level metal layer, the second level metal layer is located between the first level metal layer and the third level metal layer, the first bit-line pair is located on the third level metal layer, and the second bit-line pair is located on the first level metal layer.

Example embodiment 3 based on Example embodiment 2: the dual-port memory structure further comprising a plurality of first word-lines and a plurality of second word-lines. The first word-lines are connected with the dual-port memory cells of the grouped-cells in the word-line routing direction. The second word-lines are connected with the dual-port memory cells of the grouped-cells in the word-line routing direction. The first word-lines and the second word-lines are located on different two of the level metal layers.

Example embodiment 4 based on Example embodiment 3: the level metal layers comprises a fourth level metal layer, a fifth level metal layer and a sixth level metal layer, the fifth level metal layer is located between the fourth level metal layer and the sixth level metal layer, the first bit-line pair is located on the sixth level metal layer, and the second bit-line pair is located on the fourth level metal layer.

Example embodiment 5 based on Example embodiment 1: each grouped-cell comprises a gate end dielectric layer line located between adjacent two of the dual-port memory cells and separating a gate layer of adjacent two of the dual-port memory cells.

Example embodiment 6 based on Example embodiment 5: the gate end dielectric layer line is a continuous line.

Example embodiment 7 based on Example embodiment 1: each dual-port memory cell comprises a first port and a second port, the first port is connected with the first bit-line pair, and the second port is connected with the second bit-line pair, the first port.

Example embodiment 8 based on Example embodiment 1: each dual-port memory cell comprises a plurality of oxide diffusions and a plurality of dielectric gates, the dielectric gates separate the oxide diffusions, and the dielectric gates are substantially symmetrical relative to a connection of adjacent two of the dual-port memory cells.

Example embodiment 9 based on Example embodiment 1: each dual-port memory cell comprises a substrate, a plurality of oxide diffusions and a plurality of dielectric gates, the oxide diffusions and the dielectric gates are disposed on the substrate, the dielectric gates separate the oxide diffusions, and each dielectric gate has a depth that extends into an isolation layer within the substrate in a range of 5 nm to 60 nm.

Example embodiment 10 based on Example embodiment 1: each dual-port memory cell comprises a substrate, a plurality of oxide diffusions and a plurality of dielectric gates, the oxide diffusions and the dielectric gates are disposed on the substrate, the dielectric gates separate the oxide diffusions, and each dielectric gate has a depth that extends into a well region within the substrate in a range of 15 nm to 150 nm.

Example embodiment 11: a dual-port memory structure includes a plurality of grouped-cells, a plurality of continuous oxide diffusion lines, a dielectric gate and a gate end dielectric layer line. The grouped-cells are in a word-line routing direction, wherein each grouped-cell comprises a plurality of dual-port memory cells adjacently disposed and placed in the word-line routing direction, wherein the each dual-port memory cell comprises a plurality of transistor devices. The transistor devices are disposed upon the continuous oxide diffusion lines. The dielectric gate breaks one of the oxide diffusion lines. The gate end dielectric layer line is located between adjacent two of the dual-port memory cells and separating a gate layer of adjacent two of the dual-port memory cells.

Example embodiment 12 based on Example embodiment 11: the gate end dielectric layer line is a continuous line.

Example embodiment 13 based on Example embodiment 11: the dual-port memory structure further includes a first bit-line pair and a second bit-line pair. The dual-port memory cells of each grouped-cell share the first bit-line pair and the second bit-line pair, and the first bit-line pair and the second bit-line pair are located on different two of a plurality of level metal layers.

Example embodiment 14 based on Example embodiment 13: the level metal layers comprises a first level metal layer, a second level metal layer and a third level metal layer, the second level metal layer is located between the first level metal layer and the third level metal layer, the first bit-line pair is located on the third level metal layer, and the second bit-line pair is located on the first level metal layer.

Example embodiment 15 based on Example embodiment 13: the dual-port memory structure further includes a plurality of first word-lines and a plurality of second word-lines. The first word-lines are connected with the dual-port memory cells of the grouped-cells in the word-line routing direction. The second word-lines are connected with the dual-port memory cells of the grouped-cells in the word-line routing direction. The first word-lines and the second word-lines are located on different two of the level metal layers.

Example embodiment 16 based on Example embodiment 15: the level metal layers comprises a fourth level metal layer, a fifth level metal layer and a sixth level metal layer, the fifth level metal layer is located between the fourth level metal layer and the sixth level metal layer, the first bit-line pair is located on the sixth level metal layer, and the second bit-line pair is located on the fourth level metal layer.

Example embodiment 17 based on Example embodiment 13: each dual-port memory cell comprises a first port and a second port, the first port is connected with the first bit-line pair, and the second port is connected with the second bit-line pair, the first port.

Example embodiment 18 based on Example embodiment 13: each dual-port memory cell comprises a plurality of oxide diffusions and a plurality of dielectric gates, the dielectric gates separate the oxide diffusions, and the dielectric gates are substantially symmetrical relative to a connection of adjacent two of the dual-port memory cells.

Example embodiment 19: a dual-port memory structure includes a plurality of grouped-cells, a plurality of continuous oxide diffusion lines and a gate end dielectric layer line. The grouped-cells are in a word-line routing direction, wherein each grouped-cell comprises a plurality of dual-port memory cells adjacently disposed and placed in the word-line routing direction, wherein the each dual-port memory cell comprises a plurality of transistor devices. The transistor devices are disposed upon the continuous oxide diffusion lines. The gate end dielectric layer line is located between adjacent two of the dual-port memory cells and separating a gate layer of adjacent two of the dual-port memory cells. One of the transistor devices breaks one of the oxide diffusion lines.

Example embodiment 20 based on Example embodiment 19: the gate end dielectric layer line is a continuous line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A dual-port memory structure, comprising:

a plurality of grouped-cells in a word-line routing direction, wherein each grouped-cell comprises a plurality of dual-port memory cells adjacently disposed and placed in the word-line routing direction;

a first bit-line pair; and a second bit-line pair;

wherein the dual-port memory cells of each grouped-cell share the first bit-line pair and the second bit-line pair, and the first bit-line pair and the second bit-line pair are located on different two of a plurality of level metal layers;

wherein each grouped-cell comprises:

a gate end dielectric layer line located between adjacent two of the dual-port memory cells and separating a gate layer of adjacent two of the dual-port memory cells;

wherein the gate end dielectric layer line is a continuous line.

2. The dual-port memory structure according to claim 1, wherein the level metal layers comprises a first level metal layer, a second level metal layer and a third level metal layer, the second level metal layer is located between the first level metal layer and the third level metal layer, the first bit-line pair is located on the third level metal layer, and the second bit-line pair is located on the first level metal layer.

3. The dual-port memory structure according to claim 1, further comprising:

a plurality of first word-lines connected with the dual-port memory cells of the grouped-cells in the word-line routing direction; and a plurality of second word-lines connected with the dual-port memory cells of the grouped-cells in the word-line routing direction;

wherein the first word-lines and the second word-lines are located on different two of the level metal layers.

4. The dual-port memory structure according to claim 3, wherein the level metal layers comprises a fourth level metal layer, a fifth level metal layer and a sixth level metal layer, the fifth level metal layer is located between the fourth level metal layer and the sixth level metal layer, the first bit-line pair is located on the sixth level metal layer, and the second bit-line pair is located on the fourth level metal layer.

5. The dual-port memory structure according to claim 1, wherein each dual-port memory cell comprises a first port and a second port, the first port is connected with the first bit-line pair, and the second port is connected with the second bit-line pair, the first port.

6. The dual-port memory structure according to claim 1, wherein each dual-port memory cell comprises a plurality of oxide diffusions and a plurality of dielectric gates, the dielectric gates separate the oxide diffusions, and the dielectric gates are substantially symmetrical relative to a connection of adjacent two of the dual-port memory cells.

7. The dual-port memory structure according to claim 1, wherein each dual-port memory cell comprises a substrate, a plurality of oxide diffusions and a plurality of dielectric gates, the oxide diffusions and the dielectric gates are disposed on the substrate, the dielectric gates separate the oxide diffusions, and each dielectric gate has a depth that extends into an isolation layer within the substrate in a range of 5 nanometers (nm) to 60 nm.

8. The dual-port memory structure according to claim 1, wherein each dual-port memory cell comprises a substrate, a plurality of oxide diffusions and a plurality of dielectric gates, the oxide diffusions and the dielectric gates are disposed on the substrate, the dielectric gates separate the oxide diffusions, and each dielectric gate has a depth that extends into a well region within the substrate in a range of 15 nm to 150 nm.

9. A dual-port memory structure, comprising:

a plurality of grouped-cells in a word-line routing direction, wherein each grouped-cell comprises a plurality of dual-port memory cells adjacently disposed and placed in the word-line routing direction;

wherein each grouped-cell comprises:

a plurality of oxide diffusion lines;

a dielectric gate dividing one of the oxide diffusion lines; and a gate end dielectric layer line located between adjacent two of the dual-port memory cells and separating a gate layer of adjacent two of the dual-port memory cells;

wherein the gate end dielectric layer line is a continuous line.

10. The dual-port memory structure according to claim 9, further comprising:

a first bit-line pair; and a second bit-line pair;

wherein the dual-port memory cells of each grouped-cell share the first bit-line pair and the second bit-line pair, and the first bit-line pair and the second bit-line pair are located on different two of a plurality of level metal layers.

11. The dual-port memory structure according to claim 10, wherein the level metal layers comprises a first level metal layer, a second level metal layer and a third level metal layer, the second level metal layer is located between the first level metal layer and the third level metal layer, the first bit-line pair is located on the third level metal layer, and the second bit-line pair is located on the first level metal layer.

12. The dual-port memory structure according to claim 10, further comprising:

a plurality of first word-lines connected with the dual-port memory cells of the grouped-cells in the word-line routing direction; and a plurality of second word-lines connected with the dual-port memory cells of the grouped-cells in the word-line routing direction;

wherein the first word-lines and the second word-lines are located on different two of the level metal layers.

13. The dual-port memory structure according to claim 12, wherein the level metal layers comprises a fourth level metal layer, a fifth level metal layer and a sixth level metal layer, the fifth level metal layer is located between the fourth level metal layer and the sixth level metal layer, the first bit-line pair is located on the sixth level metal layer, and the second bit-line pair is located on the fourth level metal layer.

14. The dual-port memory structure according to claim 10, wherein each dual-port memory cell comprises a first port and a second port, the first port is connected with the first bit-line pair, and the second port is connected with the second bit-line pair, the first port.

15. The dual-port memory structure according to claim 10, wherein each dual-port memory cell comprises a plurality of oxide diffusions and a plurality of dielectric gates, the dielectric gates separate the oxide diffusions, and the dielectric gates are substantially symmetrical relative to a connection of adjacent two of the dual-port memory cells.

16. A dual-port memory structure, comprising:

a plurality of grouped-cells in a word-line routing direction, wherein each grouped-cell comprises a plurality of dual-port memory cells adjacently disposed and placed in the word-line routing direction;

wherein each grouped-cell comprises:

a plurality of oxide diffusion lines; and a dielectric gate extending to a well region; and a gate end dielectric layer line located between adjacent two of the dual-port memory cells and separating a gate layer of adjacent two of the dual-port memory cells;

wherein the gate end dielectric layer line is a continuous line.

17. The dual-port memory structure according to claim 16, wherein the gate end dielectric layer line covers adjacent two sides of the dielectric gate.

18. The dual-port memory structure according to claim 16, further comprising:

a first bit-line pair; and a second bit-line pair;

wherein the dual-port memory cells of each grouped-cell share the first bit-line pair and the second bit-line pair, and the first bit-line pair and the second bit-line pair are located on different two of a plurality of level metal layers.

19. The dual-port memory structure according to claim 18, wherein the level metal layers comprises a first level metal layer, a second level metal layer and a third level metal layer, the second level metal layer is located between the first level metal layer and the third level metal layer, the first bit-line pair is located on the third level metal layer, and the second bit-line pair is located on the first level metal layer.

20. The dual-port memory structure according to claim 18, further comprising:

a plurality of first word-lines connected with the dual-port memory cells of the grouped-cells in the word-line routing direction; and a plurality of second word-lines connected with the dual-port memory cells of the grouped-cells in the word-line routing direction;

wherein the first word-lines and the second word-lines are located on different two of the level metal layers.

* * * * *